(12) United States Patent
Hwang et al.

(10) Patent No.: US 9,202,570 B2
(45) Date of Patent: Dec. 1, 2015

(54) THREE-DIMENSIONAL SEMICONDUCTOR DEVICE

(71) Applicant: SAMSUNG ELECTRONICS CO., LTD., Suwon-si, Gyeonggi-do (KR)

(72) Inventors: Sung-Min Hwang, Seoul (KR); Hansoo Kim, Suwon-si (KR); Woonkyung Lee, Seongnam-si (KR); Wonseok Cho, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/142,158

(22) Filed: Dec. 27, 2013

(65) Prior Publication Data

US 2014/0183756 A1 Jul. 3, 2014

(30) Foreign Application Priority Data

Jan. 2, 2013 (KR) ........................ 10-2013-0000289

(51) Int. Cl.
*H01L 29/40* (2006.01)
*G11C 16/04* (2006.01)
*H01L 29/788* (2006.01)
*H01L 29/792* (2006.01)
*H01L 27/115* (2006.01)

(52) U.S. Cl.
CPC ...... *G11C 16/0483* (2013.01); *H01L 27/11556* (2013.01); *H01L 27/11582* (2013.01); *H01L 29/7889* (2013.01); *H01L 29/7926* (2013.01); *H01L 2924/0002* (2013.01)

(58) Field of Classification Search
USPC ............... 257/5, 59, 202–211, 291, 390, 443, 257/448, E27.026, E27.11, E27.121, 257/E27.124, E27.126, E27.133, E27.144, 257/E25.002–E25.028, 302, 773, 774, 257/E27.096, E29.183, E29.186, E29.274
See application file for complete search history.

(56) References Cited

U.S. PATENT DOCUMENTS

| | | | |
|---|---|---|---|
| 7,952,136 B2 | 5/2011 | Kito et al. | |
| 8,237,211 B2 | 8/2012 | Fukuzumi et al. | |
| 8,338,956 B2 | 12/2012 | Maeda | |
| 8,394,716 B2 * | 3/2013 | Hwang et al. | 438/667 |
| 8,431,969 B2 | 4/2013 | Kim et al. | |
| 8,787,082 B2 * | 7/2014 | Son et al. | 365/185.05 |
| 2010/0052042 A1 | 3/2010 | Tanaka et al. | |
| 2011/0180941 A1 | 7/2011 | Hwang et al. | |
| 2011/0316072 A1 | 12/2011 | Lee | |

FOREIGN PATENT DOCUMENTS

| | | |
|---|---|---|
| JP | 2011-204829 | 10/2011 |
| KR | 10-1055587 B1 | 8/2011 |

* cited by examiner

*Primary Examiner* — Jasmine Clark
(74) *Attorney, Agent, or Firm* — Lee & Morse, P.C.

(57) ABSTRACT

A three-dimensional semiconductor device includes a substrate having a cell array region between first and second contact regions. A first stack includes a plurality of first electrodes vertically provided on the substrate, and a second stack includes a plurality of second electrodes vertically provided on the first stack. The second stack is arranged to expose end portions of the first electrodes on the first contact region and overlap end portions of the first electrodes on the second contact region.

20 Claims, 21 Drawing Sheets

THREE-DIMENSIONAL SEMICONDUCTOR DEVICE

CROSS-REFERENCE TO RELATED APPLICATION

Korean Patent Application No. 10-2013-0000289, filed on Jan. 2, 2013, and entitled: "Three-Dimensional Semiconductor Device," is incorporated by reference herein in its entirety.

BACKGROUND

1. Field

One or more embodiments described herein relate to a semiconductor device.

2. Description of the Related Art

Higher integration of semiconductor memory devices is desired to satisfy consumer demand for superior performance and inexpensive prices. In the case of two-dimensional or planar semiconductor memory devices, integration may be determined by the area occupied per unit memory cell. Attempts to increase integration in these devices include the use of fine pattern forming technology. However, process equipment for increasing pattern fineness may be very expensive. The expense may place a limitation on the amount of integration that can be practically achieved based on cost.

Recently, semiconductor memory devices with three-dimensional arrangements of memory cells have been proposed. However, in order to realize mass production of these devices, a new process technology should be developed to provide lower manufacturing cost per bit than two-dimensional memory devices. This new process technology should also have good reliability.

SUMMARY

In accordance with at least one embodiment, a three-dimensional semiconductor device includes a substrate including a cell array region between first and second contact regions; a first stack including a plurality of first electrodes vertically provided on the substrate; and a second stack including a plurality of second electrodes vertically provided on the first stack, wherein the second stack is arranged to expose end portions of the first electrodes on the first contact region and overlap end portions of the first electrodes on the second contact region.

Also, the first electrodes in the first and the second electrodes in the second stack may have a stepwise structure on the first and second contact regions. First contact plugs may be on the first contact region and connected to respective ones of the first electrodes; and second contact plugs may be on the second contact region and connected to respective ones of the second electrodes.

Also, first contact plugs may be on the first contact region and connected to respective ones of the first electrodes; and second contact plugs may be on the first contact region and connected to respective ones of the second electrodes. A longest one of the second electrodes may be longer than a shortest one of the first electrodes.

Also, the first electrodes may include first sidewalls located at different horizontal positions on the first contact region, and second sidewalls vertically aligned with each other on the second contact region. A longest one of the second electrodes may be shorter than a shortest one of the first electrodes.

Also, each of the first and second stacks may have a sloped profile on the first contact region and a vertical profile on the second contact region.

Also, each of the first and second electrodes may include extended portions extending at an angle relative to a top surface of the substrate, and extended portions of each of the first and second stacks may have top surfaces that are substantially coplanar with each other.

Also, the substrate may include the cell array region and the first and second contact regions in a first direction, and the cell array region and dummy regions may be at respective sides of the cell array region in a second direction perpendicular to the first direction, and a horizontal length of the first stack in the second direction may be substantially equal to a horizontal length of the second stack.

Also, a third stack including a plurality of third electrodes may be vertically provided on the second stack, wherein the third stack may be arranged to expose end portions of the second electrodes on the second contact region, to expose end portions of the first electrodes on the first contact region, and to overlap end portions of the second electrodes on the first contact region.

Also, first contact plugs may be on the first contact region and connected to respective ones of the first electrodes; second contact plugs may be on the second contact region and connected to respective ones of the second electrodes; and third contact plugs may be provided on the first contact region and connected to respective ones of the third electrodes.

Also, a third stack including a plurality of third electrodes may be vertically provided on the second stack, wherein the third stack may be arranged to expose end portions of the second electrodes on the first contact region and to overlap end portions of the first and second electrodes on the second contact region.

Also, first contact plugs may be on the first contact region and connected to respective ones of the first electrodes; second contact plugs may be on the first contact region and connected to respective ones of the second electrodes; and third contact plugs may be on the first contact region and connected to respective ones of the third electrodes.

Also, vertical structures may be on the cell array region that penetrate the first and second stacks; and data storing elements may be interposed between the vertical structures and the first and second electrodes.

In accordance with another embodiment, a three-dimensional semiconductor device includes a cell array region between first and second contact regions; a plurality of first electrodes having ends vertically arranged over the first contact region; and a plurality of second electrodes having ends vertically arranged over the second contact region, wherein the ends of the first electrodes are arranged to have a first stepwise pattern and the ends of the second electrodes have are arranged to have a second stepwise pattern different from the first stepwise pattern.

Also, the ends of a first number of the first electrodes may overlap the ends of a second number of the first electrodes over at least one of the first contact region or the second contact region. The first number is at least one and the second number is at least one, and the first and second electrodes overlap the cell array region.

Also, the ends of the first electrodes over the first contact region may be arranged to have a first slope, and ends of the first electrodes over the second contact region may be arranged to have a second slope different from the first slope.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
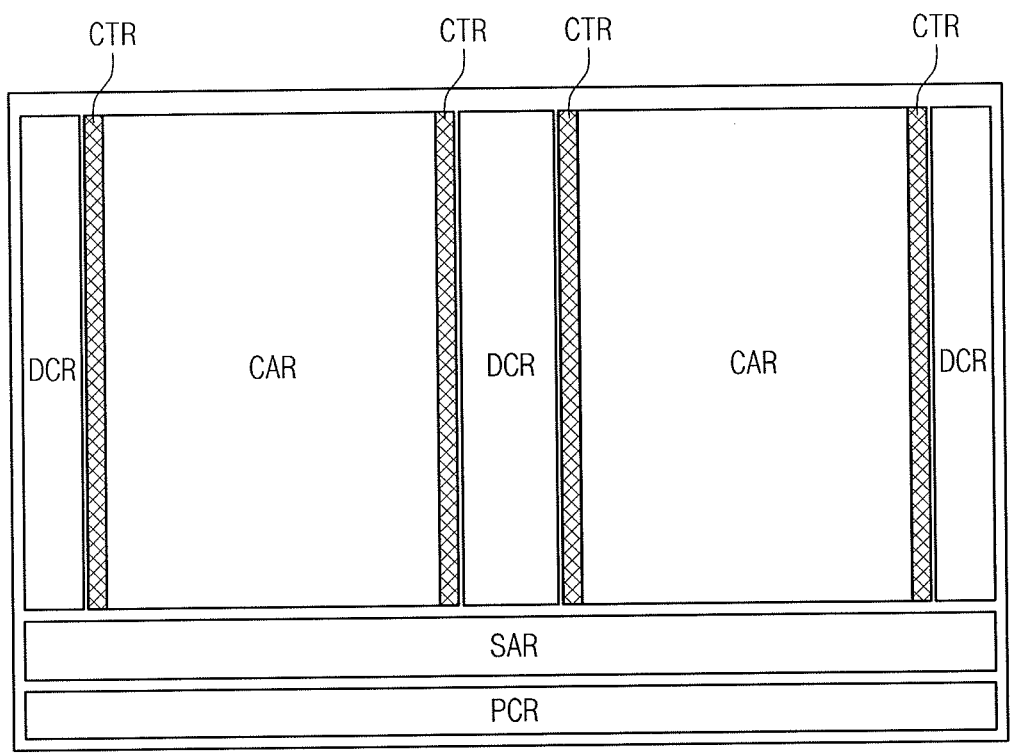
FIG. 1 illustrates an example of a three-dimensional semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an example of a layout of a three-dimensional semiconductor device which includes a cell array region CAR, a peripheral circuit region PCR, a sense amplifier region SAR, a decoding circuit region DCR, and a contact region CTR. A plurality of memory cells, a plurality of bit lines, and a plurality of word lines may be provided on the cell array region CAR. The word lines (e.g., horizontal electrodes) may be vertically stacked on the cell array region CAR. Circuits for operating the memory cells may be provided on the peripheral circuit region PCR. Circuits for reading out data stored in the memory cells may be provided in the sense amplifier region SAR.

The contact region CTR is provided between the cell array region CAR and the decoding circuit region DCR. Further, an interconnection structure may be provided on the contact region CTR to connect the word lines electrically to the circuits of the decoding circuit region DCR.

In example embodiments, the word lines (e.g., horizontal electrodes) may extend from the cell array region CAR to the contact region CTR and form a stepwise structure on the contact region CTR for connecting the word lines easily to the circuits of the decoding circuit region.

As the number of the stacked word lines increases, an occupying area of the contact region CTR or the stepwise structure may also increase. This may cause a reduction in ratio of an area of the cell array region CAR to the total chip area. However, according to example embodiments, it is possible to prevent an area of the cell array region CAR from decreasing and/or to prevent the occupying area of the stepwise structure or the contact region CTR from increasing.

Figure 2:
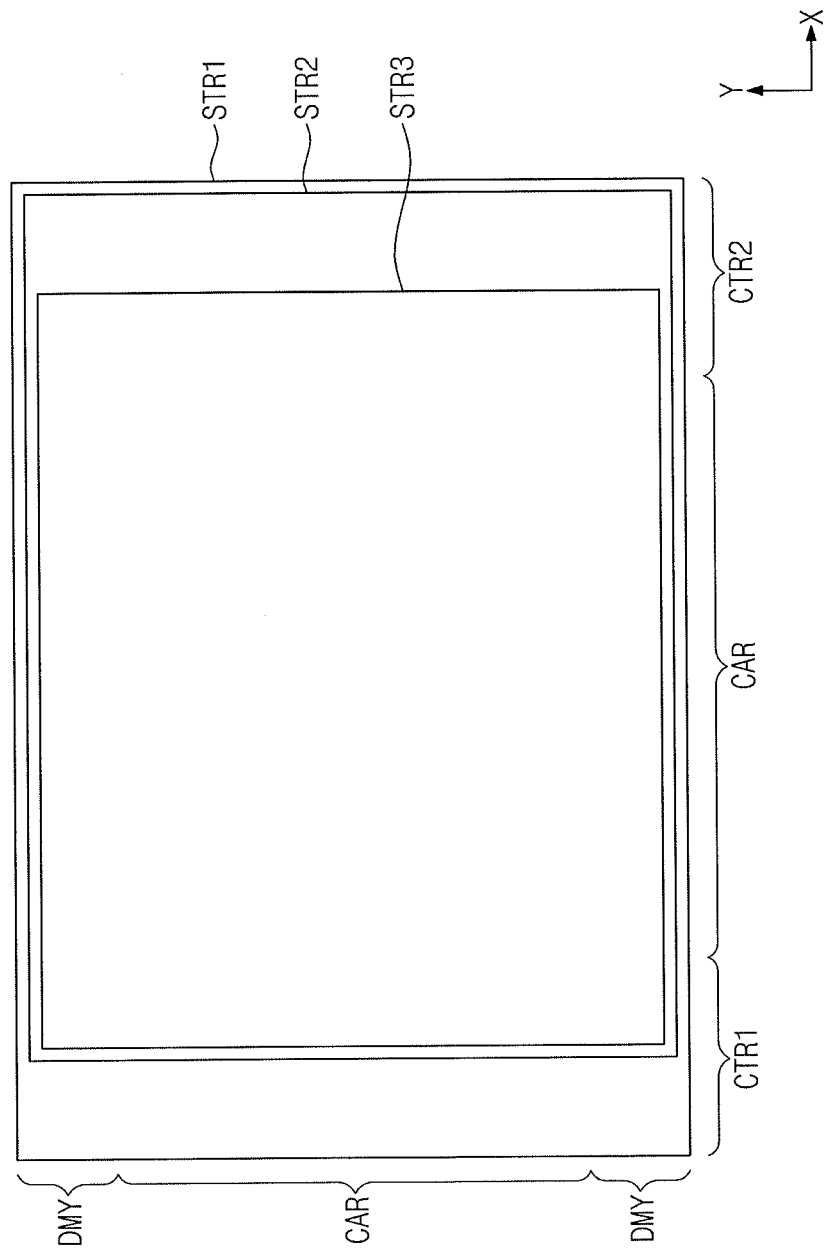
FIG. 2 illustrates a first embodiment of a three-dimensional semiconductor device.
Figure 3:
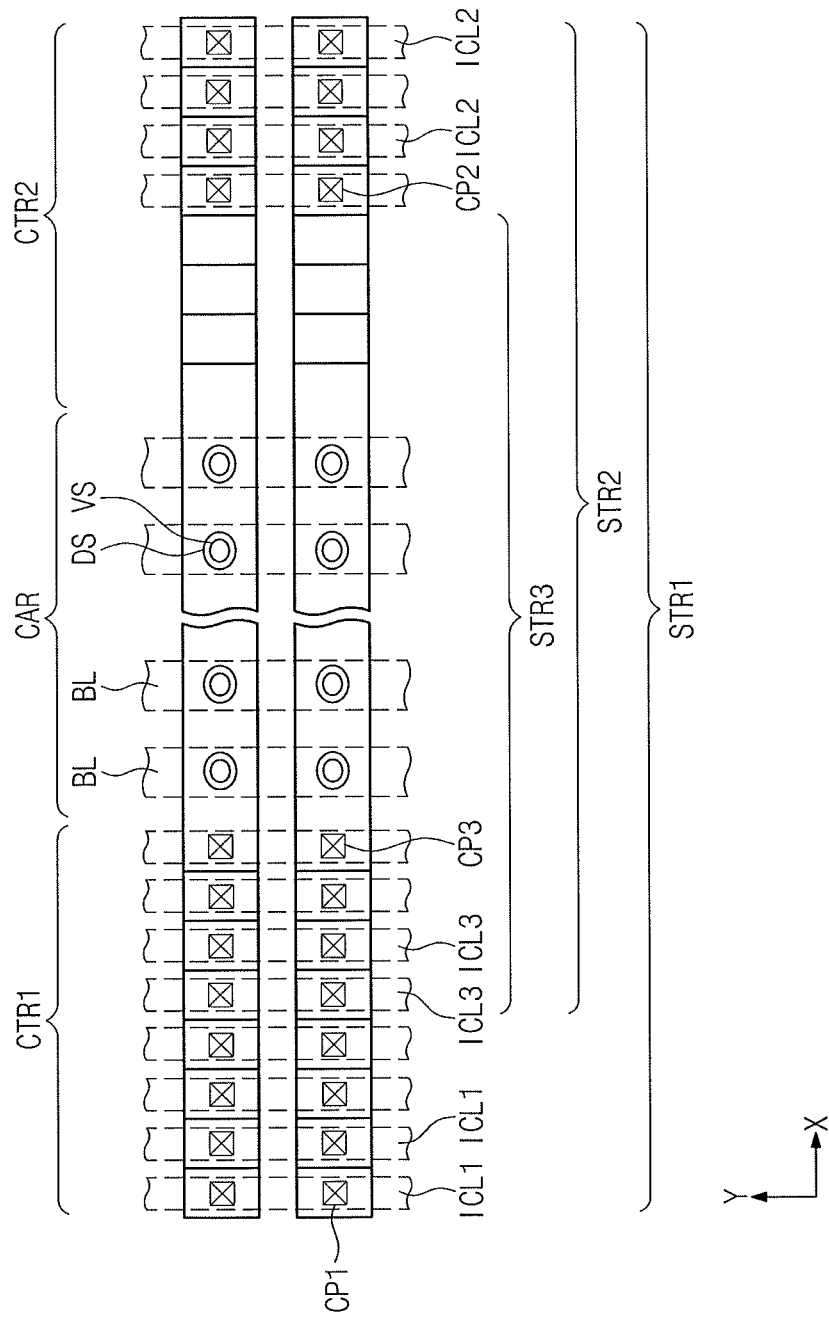
FIG. 3 illustrates a portion of the first embodiment of the semiconductor device.
Figure 4:
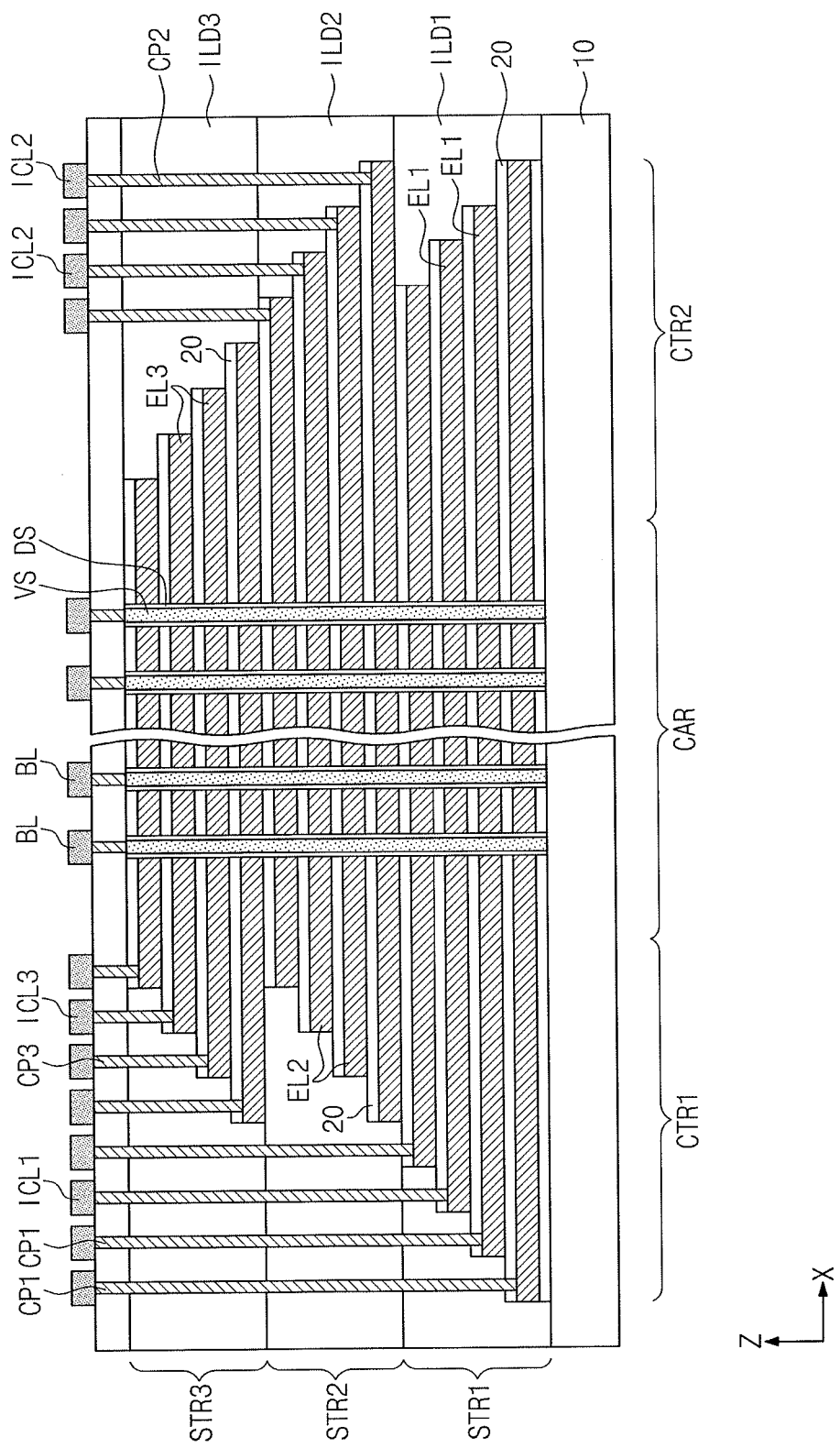
FIG. 4 illustrates a sectional view taken along the x-axis direction in FIG. 3.
Figure 5:
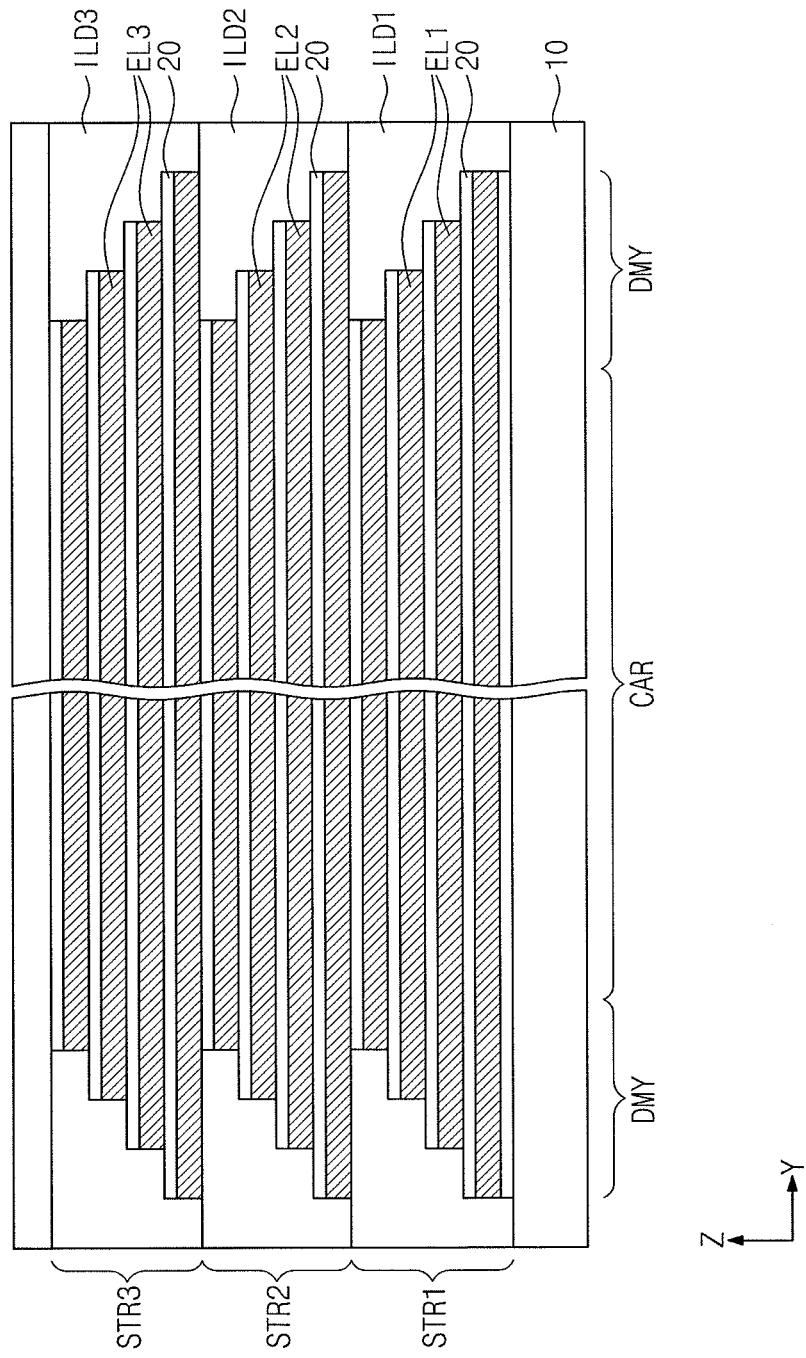
FIG. 5 illustrates a sectional view taken along the y-axis direction of FIG. 3.

FIG. 2 illustrates a first embodiment of a three-dimensional semiconductor device. FIG. 3 shows a portion of this device. FIGS. 4 and 5 are sectional views respectively taken along x- and y-axes of FIG. 3.

Referring to FIGS. 2 through 5, a first stack STR1, a second stack STR2, and a third stack STR3 may be sequentially stacked on a substrate 10. The substrate 10 may include at least one of a semiconductor material (e.g., silicon wafer), an insulating material (e.g., glass), or a semiconductor or conductive material covered with an insulating material. For example, the substrate 10 may be a silicon wafer of a first conductivity type.

In an x-axis direction, the substrate 10 may include a first contact region CTR1 and a second contact region CTR2. The cell array region CAR is interposed between the first and second contact regions CTR1 and CTR2. In a y-axis direction (which, for example, may be perpendicular to the x-axis direction), the substrate 10 may include the cell array region CAR between two dummy regions DMY.

In example embodiments, each of the first to third stacks STR1, STR2, and

STR3 may have a plate-shaped structure covering wholly the cell array region CAR of the substrate 10. Alternatively, as shown in FIG. 3, each of the first to third stacks STR1, STR2, and STR3 may have a line-shaped structure extending along the x-axis direction.

Referring to FIGS. 4 and 5, the first stack STR1 may include a plurality of first electrodes EL1 that are vertically stacked on the substrate 10. The first stack STR1 may further include insulating layers 20 that are vertically stacked to be interposed between the first electrodes ELL The first electrodes EL1 of the first stack STR1 may have the same thickness, or at least one thereof may have a thickness different from that of the others.

As shown in FIGS. 4 and 5, the first stack STR1 may have stepwise portions formed on the first and second contact regions CTR1 and CTR2, respectively. Further, the first stack STR1 may have a stepwise portion on the dummy regions DMY. In other words, on the first and second contact regions CTR1 and CTR2 and the dummy regions DMY, a vertical thickness of the first stack STR1 may increase with decreasing distance from the cell array region CAR. This means that the first stack STR1 may have a sloped profile on the first and second contact regions CTR1 and CTR2 and the dummy regions DMY.

Each of the first electrodes EL1 may include a first sidewall located on the first contact region CTR1 and a second sidewall located on the second contact region CTR2. The first sidewalls of the first electrodes EL1 may be positioned at different horizontal positions from each other on the first contact region CTR1. The second sidewalls of the first electrodes EU may be located at different horizontal positions from each other on the second contact region CTR2. In other words, in each of the first and second contact regions CTR1 and CTR2, end portions of the first electrodes EL1 may be located at different horizontal positions from each other. In example embodiments, horizontal distances between the first sidewalls may be substantially uniform on the first stack STR1. However, in other embodiments, these distances may be different.

Furthermore, on the dummy regions DMY, horizontal positions of sidewalls of the first electrodes EL1 may be different from each other. Horizontal distances between the sidewalls may be substantially uniform on the dummy region DMY, or different in other embodiments. Also, the horizontal distances between the first sidewalls of the first electrodes EL1 may be substantially the same as the horizontal distances between the sidewalls of the first electrodes EL1 on the dummy region DMY. In other embodiments, these horizontal distances may be different.

A first interlayered dielectric layer ILD1 may be provided on the substrate 10 to cover the end portions of the first electrodes ELL For example, the first interlayered dielectric layer ILD1 may cover the first stack STR1 on the first and second contact regions CTR1 and CTR2. The first interlayered dielectric layer ILD1 may have a top surface that is coplanar with that of the first stack STR1.

Referring to FIGS. 4 and 5, the second stack STR2 may include a plurality of second electrodes EL2 that are vertically stacked on the first stack STR1. The second stack STR2 may further include insulating layers 20 that are vertically stacked to be interposed between the second electrodes EL2. The second electrodes EL2 of the second stack STR2 may have the same thickness, or at least one thereof may have a thickness different from that of the others.

As shown in FIGS. 4 and 5, the second stack STR2 may have stepwise portions formed on the first and second contact regions CTR1 and CTR2, respectively. Further, the second stack STR2 may have a stepwise portion on the dummy regions DMY. In other words, on the first and second contact regions CTR1 and CTR2 and the dummy regions DMY, a vertical thickness of the second stack STR2 may increase with decreasing distance from the cell array region CAR. This means that the second stack STR2 may have a sloped profile on the first and second contact regions CTR1 and CTR2 and the dummy regions DMY.

Furthermore, in plan view, the end portions of the first electrodes EL1 on the first contact region CTR1 may be exposed by the second stack STR2, while the end portions of the first electrodes EL1 on the second contact region CTR2 may overlap the second stack STR2. In addition, in plan view, the second stack STR2 may overlap the end portions of the first electrodes EL1 on the dummy regions DMY.

Each of the second electrodes EL2 may include a first sidewall located on the first contact region CTR1 and a second sidewall located on the second contact region CTR2. On the first contact region CTR1, the first sidewalls of the second electrodes EL2 may be located at different horizontal positions from those of the first sidewalls of the first electrodes ELL The first sidewalls of the second electrodes EL2 may be located at different horizontal positions from each other. On the second contact region CTR2, the second sidewalls of the second electrodes EL2 may be located at different horizontal positions from each other. In other words, in each of the first and second contact regions CTR1 and CTR2, the end portions of the second electrodes EL2 may be located at different horizontal positions from each other.

Furthermore, in terms of a length in the first direction, the longest one of the second electrodes EL2 of the second stack STR2 may be longer than the shortest one of the first electrodes EL1 of the first stack STR1. For example, the lowermost one of the second electrodes EL2 of the second stack STR2 may be longer than the uppermost one of the first electrodes EL1 of the first stack STR1.

Furthermore, on the dummy regions DMY, horizontal positions of the sidewalls of the second electrodes EL2 may be different from each other. Also, horizontal distances between the sidewalls of the second electrodes EL2 may be substantially uniform on the dummy region DMY. In addition, the horizontal distances between the first sidewalls of the second electrodes EL2 may be substantially the same as the horizontal distances between the sidewalls of the second electrodes EL2 on the dummy region DMY. Also, the lowermost one of the second electrodes EL2 may be substantially the same as the lowermost one of the first electrodes EL1, in terms of a length in the second direction.

A second interlayered dielectric layer ILD2 may be provided on the first interlayered dielectric layer ILD1 to cover the end portions of the second electrodes EL2. The second interlayered dielectric layer ILD2 may cover the second stack STR2 on the first and second contact regions CTR1 and CTR2. The second interlayered dielectric layer ILD2 may have a top surface that is substantially coplanar with that of the second stack STR2.

Referring to FIGS. 4 and 5, the third stack STR3 may include a plurality of third electrodes EL3 that are vertically stacked on the second stack STR2. The third stack STR3 may further include insulating layers 20 interposed between respective pairs of the third electrodes EL3. The third electrodes EL3 of the third stack STR3 may have substantially the same thickness, or at least one thereof may have a thickness different from that of the others.

As shown in FIGS. 4 and 5, the third stack STR3 may have stepwise portions formed on the first and second contact regions CTR1 and CTR2. Further, the third stack STR3 may have a stepwise portion on the dummy regions DMY. In other words, on each of the first and second contact regions CTR1 and CTR2, a vertical thickness of the third stack STR3 may increase with decreasing distance from the cell array region CAR. This means that the third stack STR3 may have a sloped profile on the first and second contact regions CTR1 and CTR2 and the dummy regions DMY.

Furthermore, in plan view, the end portions of the second electrodes EL2 on the second contact region CTR2 may be exposed by the third stack STR3, while the end portions of the second electrodes EL2 on the first contact region CTR1 may overlap the third stack STR3. The third stack STR3 may expose the end portions of the first electrodes EL1 on the first contact region CTR1. In addition, in plan view, the third stack STR3 may overlap end portions of the first and second electrodes EL1 and EL2 on the dummy regions DMY.

Each of the third electrodes EL3 may include a first sidewall located on the first contact region CTR1 and a second sidewall located on the second contact region CTR2. The first sidewalls of the third electrodes EL3 may be located at different horizontal positions from each other on the first contact region CTR1. The second sidewalls of the third electrodes EL3 may be located at different horizontal positions from each other on the second contact region CTR2. For example, in each of the first and second contact regions CTR1 and CTR2, the end portions of the third electrodes EL3 may be located at different horizontal positions from each other. In plan view, the end portions of the third electrodes EL3 on the first contact region CTR1 may overlap end portions of the second electrodes EL2.

In terms of a length in the first direction, the longest one of the third electrodes EL3 of the third stack STR3 may be longer than the shortest one of the second electrodes EL2 of the second stack STR2. In other words, the lowermost one of the third electrode EL3 of the third stack STR3 may be longer than the uppermost one of the second electrodes EL2 of the second stack STR2.

Furthermore, on the dummy regions DMY, horizontal positions of the sidewalls of the third electrodes EL3 may be different from each other. Horizontal distances between the sidewalls of the third electrodes EL3 may be substantially uniform on the dummy region DMY. In addition, the horizontal distances between the first sidewalls of the third electrodes EL3 may be substantially the same as the horizontal distances between the sidewalls of the third electrodes EL3 on the dummy region DMY. The lowermost one of the third electrodes EL3 may be substantially the same as the lowermost one of the second electrodes EL2, in terms of a length in the second direction.

A third interlayered dielectric layer ILD3 may be provided on the second interlayered dielectric layer ILD2 to cover the end portions of the third electrodes EL3. The third interlayered dielectric layer ILD3 may cover the third stack STR3 on the first and second contact regions CTR1 and CTR2. The third interlayered dielectric layer ILD3 may have a top surface that is substantially coplanar with that of the third stack STR3.

Horizontal lengths of the first to third electrodes EL1, EL2, and EL3 may not decrease in a gradual manner with increasing distance from the substrate 10. For example, as described above, although the uppermost one of the first electrodes EL1 is shorter than the lowermost one thereof, the lowermost one of the second electrodes EL2 is longer than the uppermost one of the first electrodes EL1. In the case where the horizontal lengths of the electrodes decrease gradually with increasing distance from the substrate 10, the first and second contact regions should have an increased area and this leads to a reduction in area of the cell array region CAR. However, according to example embodiments, such a problem can be solved by the aforementioned structure. In other words, even if the number of the stacked electrodes is increased, it is possible to maintain an area for the cell array region CAR.

Referring to FIG. 4, an interconnection structure may be provided on the first and second contact regions CTR1 and CTR2. The interconnection structure may include first contact plugs CP1 connected to the first stack STR1, first conductive pads ICL1 connected to the first contact plugs CP1, second contact plugs CP2 connected to the second stack STR2, second conductive pads ICL2 connected to the second contact plugs CP2, third contact plugs CP3 connected to the third stack STR3, and third conductive pads ICL3 connected to the third contact plugs CP3.

In example embodiments, the first contact plugs CP1 may be provided on the first contact region CTR1. Each of the first contact plugs CP1 may penetrate the first to third interlayered dielectric layers ILD1, ILD2, and ILD3 and be connected to the end portions of the first electrodes EL1, respectively, located at different levels. The first conductive pads ICL1 may be connected to the first contact plugs CP1, respectively. The first conductive pads ICL1 may be provided at the same distance from a top surface of the substrate 10.

Shapes of the first conductive pads ICL1 may be changed in consideration of a design rule, a product specification, and/or electrical characteristics to be performed in program/erase/reading operations. In addition, upper interconnection lines may be provided on the first conductive pads ICL1 to connect the first conductive pads ICL1 to peripheral circuits.

In example embodiments, the second contact plugs CP2 may be provided on the second contact region CTR2. Each of the second contact plugs CP2 may penetrate the first and second interlayered dielectric layers ILD1 and ILD2 and be connected to the end portions of the second electrodes EL2, respectively, located at different levels. The second conductive pads ICL2 may be connected to the second contact plugs CP2, respectively, and the second conductive pads ICL2 may be provided at the same distance from the top surface of the substrate 10.

The third contact plugs CP3 may be provided on the first contact region CTR1 to be adjacent to the cell array region CAR. The third contact plugs CP3 may penetrate the third interlayered dielectric layer ILD3 and be connected to the end portions of the third electrodes EL3, respectively. The third conductive pads ICL3 may be connected to the third contact plugs CP3, respectively, and the third conductive pads ICL3 may be provided at the same distance from the top surface of the substrate 10.

In example embodiments, vertical structures VS may be provided on the cell array region CAR to penetrate the first to third stacks STR1, STR2, and STR3. In addition, a data storing layer DS may be interposed between the vertical structures VS and the first to third electrodes EL1, EL2, and EL3. Bit lines BL extending along the second direction may be provided on the cell array region CAR and be connected to the vertical structure VS. The structure of the cell array region CAR will be described in more detail with reference to FIGS. 16 through 18.

Figure 6:
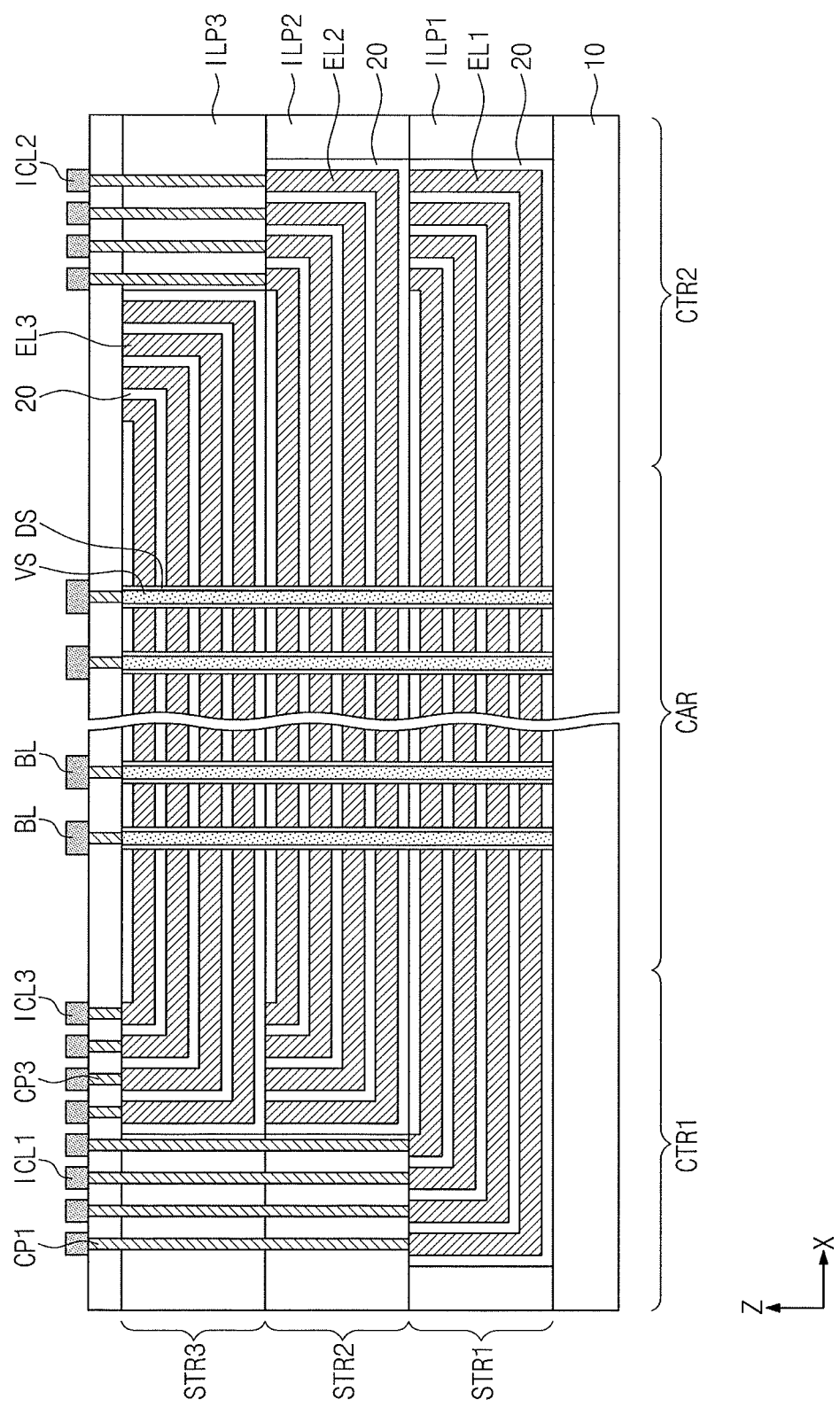
FIG. 6 illustrates a sectional view taken along the x-axis direction of FIG. 3 in accordance with a modification of the first embodiment.
Figure 7:
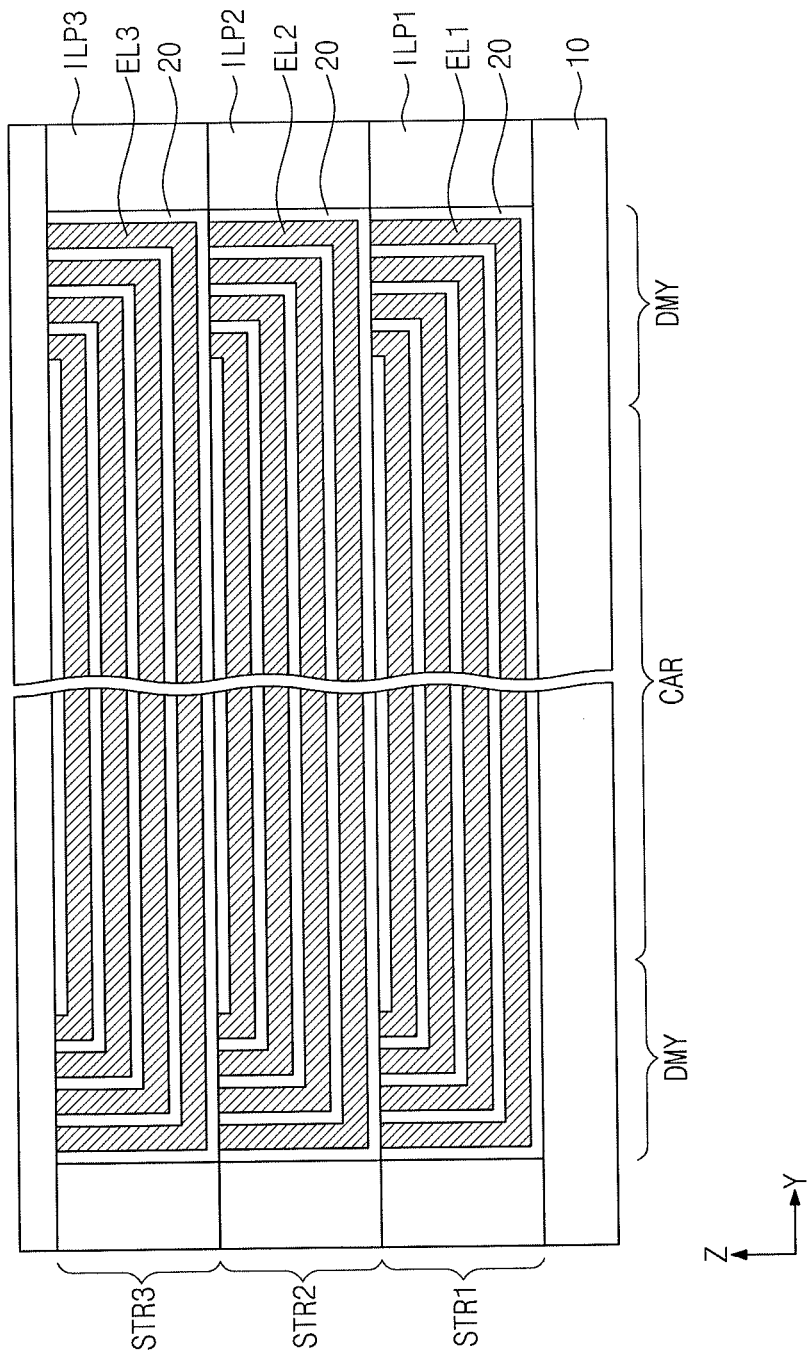
FIG. 7 illustrates a sectional view taken along the y-axis direction of FIG. 3 in accordance with a modification of the first embodiment.

FIGS. 6 and 7 illustrate sectional views taken along the x- and y-axes of FIG. 3. As described with reference to FIGS. 3 and 4, the substrate 10 may include a first contact region CTR1, a second contact region CTR2, and the cell array region CAR interposed therebetween, in an x-axis direction. The substrate may also include the cell array region CAR between the dummy regions DMY in y-axis direction, which, for example, may be perpendicular to or otherwise cross the x-axis direction.

The first stack STR1, the second stack STR2, and the third stack STR3 may be sequentially stacked on the substrate 10. More specifically, referring to FIGS. 6 and 7, a first insulating pattern ILP1 may be provided on the substrate 10 to expose the first and second contact regions CTR1 and CTR2 and the cell array region CAR. The first insulating pattern ILP 1 may be formed to define an opening exposing a portion of the substrate 10. The first insulating pattern ILP1 may be formed in such a way that the opening has a sidewall at an angle (e.g., perpendicular or another angle) to the substrate 10. The first insulating pattern ILP1 or the opening may have the sidewalls positioned on the first and second contact regions CTR1 and CTR2.

According to the present embodiment, the first stack STR1 may be provided on the substrate 10 exposed by the first insulating pattern ILP1 or in the opening. The first stack STR1 may include the first electrodes EL1 vertically stacked on the substrate 10 and the insulating layers 20 interposed between the first electrodes ELI.

Each of the first electrodes EU may include end portions located on the first and second contact regions CTR1 and CTR2, respectively. In each of the first and second contact regions CTR1 and CTR2, the end portions of the first electrodes EU may be located at horizontal positions different from each other, but their top surfaces may be located at substantially the same level.

The end portions of the first electrodes EL1 may have top surfaces that are substantially coplanar with the top surface of the first insulating pattern ILP1. In the first stack STR1, each of the first electrodes EL1 and the insulating layers 20 may include a horizontal portion parallel to the top surface of the substrate 10 and an extended portion parallel to the sidewall of the first insulating pattern ILP 1. Lengths of the horizontal portions of the first electrodes EL1 may decrease with increasing distance from the top surface of the substrate 10.

A distance between the extended portions of the first electrodes EL1 and the sidewall of the first insulating pattern ILP1 may increase with increasing distance between the horizontal portions of the first electrodes EL1 and the top surface of the substrate 10. Vertical lengths of the extended portions of the first electrodes EL1 may decrease with increasing distance from the sidewall of the first insulating pattern ILP1.

As shown in FIGS. 6 and 7, a second insulating pattern ILP2 may be provided on the first insulating pattern ILP1 to cover the end portions of the first stack STR1 on the first contact region CTR1 and to expose the end portions of the first electrodes EU on the second contact region CTR2. The second insulating pattern ILP2 may be formed to expose the end portions of the first electrodes EU on the dummy regions DMY. In other words, the second insulating pattern ILP2 may define an opening on the first stack STR1. The second insulating pattern ILP2 may be formed in such a way that the opening has a sidewall at an angle (perpendicular or at another angle) to the substrate 10. The second insulating pattern ILP2 or the opening thereof may have the sidewalls positioned on the first and second contact regions CTR1 and CTR2, respectively.

In example embodiments, the second stack STR2 may be provided in the opening defined by the second insulating pattern ILP2. The second stack STR2 may include a plurality of the second electrodes EL2 vertically stacked on the first stack STR1. In addition, the second stack STR2 may further include insulating layers 20 that are vertically stacked on the first stack STR1 and are interposed between the second electrodes EL2.

Each of the second electrodes EL2 may include end portions located on the first and second contact regions CTR1 and CTR2, respectively. On the first contact region CTR1, the end portions of the second electrodes EL2 may be disposed to be spaced apart from those of the first electrodes ELL On the second contact region CTR2, the end portions of the second electrodes EL2 may overlap those of the first electrodes EL1. Furthermore, the end portions of the second electrodes EL2 may overlap those of the first electrodes EL1 on the dummy regions DMY.

Similar to the first electrodes EL1, the end portions of the second electrodes EL2 may be located at horizontal positions different from each other, but may have top surfaces located at substantially the same level. The end portions of the second electrodes EL2 may have the top surfaces that are substantially coplanar with the top surface of the second insulating pattern ILP2. In the second stack STR2, each of the second electrodes EL2 and the insulating layers 20 may include a horizontal portion parallel to the top surface of the substrate 10 and an extended portion parallel to the sidewall of the second insulating pattern ILP2, similar to the first electrodes EL1.

In addition, as shown in FIGS. 6 and 7, a third insulating pattern ILP3 may be provided on the second insulating pattern ILP2 to expose the end portions of the second stack STR2 on the first contact region CTR1 and to cover the end portions of the first electrodes EL1 on the second contact region CTR2. The third insulating pattern ILP3 may be formed to expose the end portions of the first electrodes ELI. on the dummy regions DMY. The third insulating pattern ILP3 may be formed to define an opening on the second stack STR2. The third insulating pattern ILP3 may be formed in such a way that the opening has a sidewall at an angle (perpendicular or at another angle) to the substrate 10. The third insulating pattern ILP3 or the opening thereof may have the sidewalls positioned on the first and second contact regions CTR1 and CTR2, respectively.

The third stack STR3 may be provided in the opening defined by the third insulating pattern ILP3. The third stack STR3 may include a plurality of the third electrodes EL3 vertically stacked on the second stack STR2. The third stack STR3 may further include insulating layers 20 that are vertically stacked on the second stack STR2 and are interposed between the third electrodes EL3.

Each of the third electrodes EL3 may include end portions located on the first and second contact regions CTR1 and CTR2, respectively. On the first contact region CTR1, the end portions of the third electrodes EL3 may overlap end portions of the second electrodes EL2. On the second contact region CTR2, the end portions of the third electrodes EL3 may be spaced from end portions of the first electrodes ELI.

Furthermore, on the dummy regions DMY, the end portions of the third electrodes EL3 may overlap end portions of the second electrodes EL2. Similar to the first electrodes ELL, the end portions of the third electrodes EL3 may be located at horizontal positions different from each other, but their top surfaces may be located at substantially the same level. The end portions of the third electrodes EL3 may have the top surfaces that are substantially coplanar with the top surface of the third insulating pattern ILP3. In the third stack STR3, each of the third electrodes EL3 and the insulating layers 20 may include a horizontal portion parallel to the top surface of the substrate 10 and an extended portion parallel to the sidewall of the third insulating pattern ILP3, similar to the first electrodes EL1.

In example embodiments, the first contact plugs CP1 connected to the first stack STR1 and the third contact plugs CP3 connected to the third stack STR3 may be provided on the first contact region CTR1. The second contact plugs CP2 connected to the second stack STR2 may be provided on the second contact region CTR2. The first contact plugs CP1 may be connected to respective end portions of the first electrodes EL1 on the first contact region CTR1, and may have substantially the same vertical length. The second contact plugs CP2 may be connected to respective end portions of the second electrodes EL2 on the second contact region CTR2, and may have substantially the same vertical length. The third contact plugs CP3 may be connected to respective end portions of the third electrodes EL3 on the first contact region CTR1, and may have substantially the same vertical length.

In example embodiments, the vertical structure may be provided on the cell array region CAR to penetrate the first to third stacks STR1, STR2, and STR3. The data storing layer and the bit lines may also be provided on the cell array region CAR.

Figure 8:
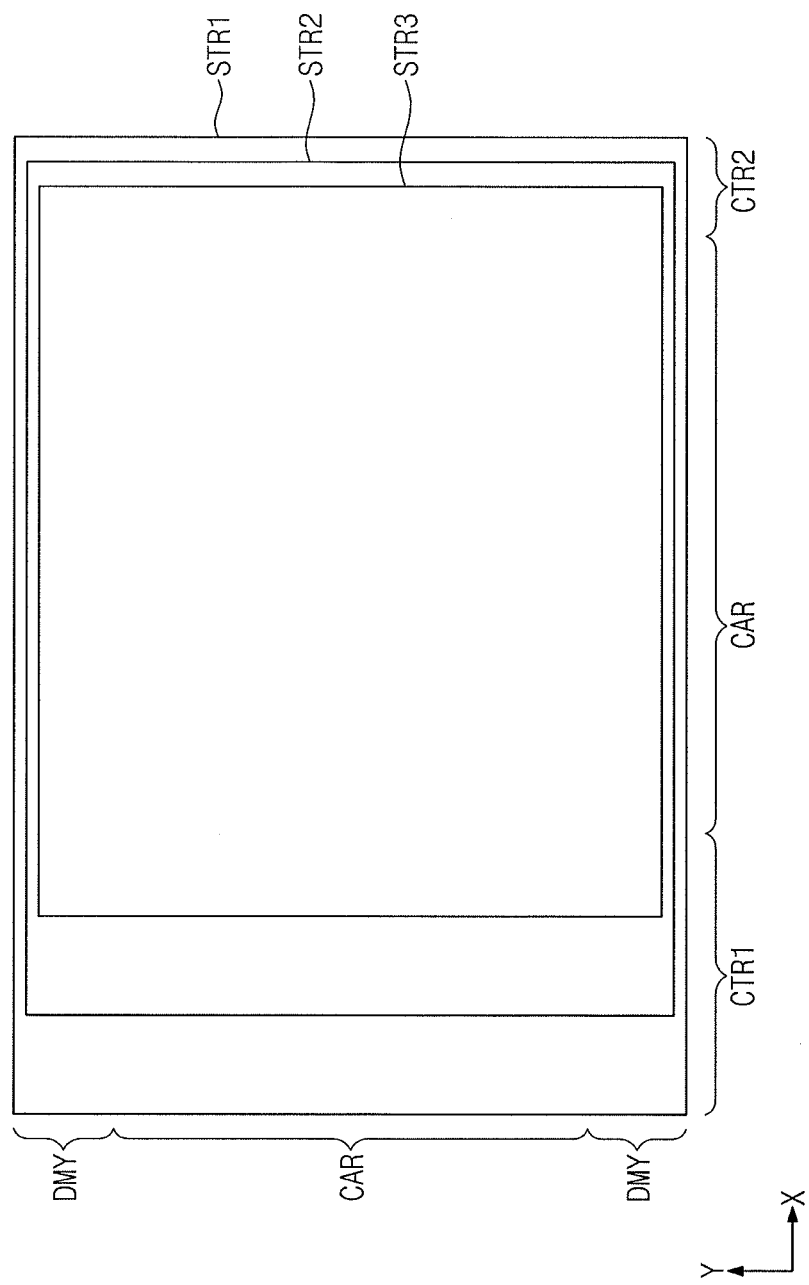
FIG. 8 illustrates a second embodiment of a three-dimensional semiconductor device.
Figure 9:
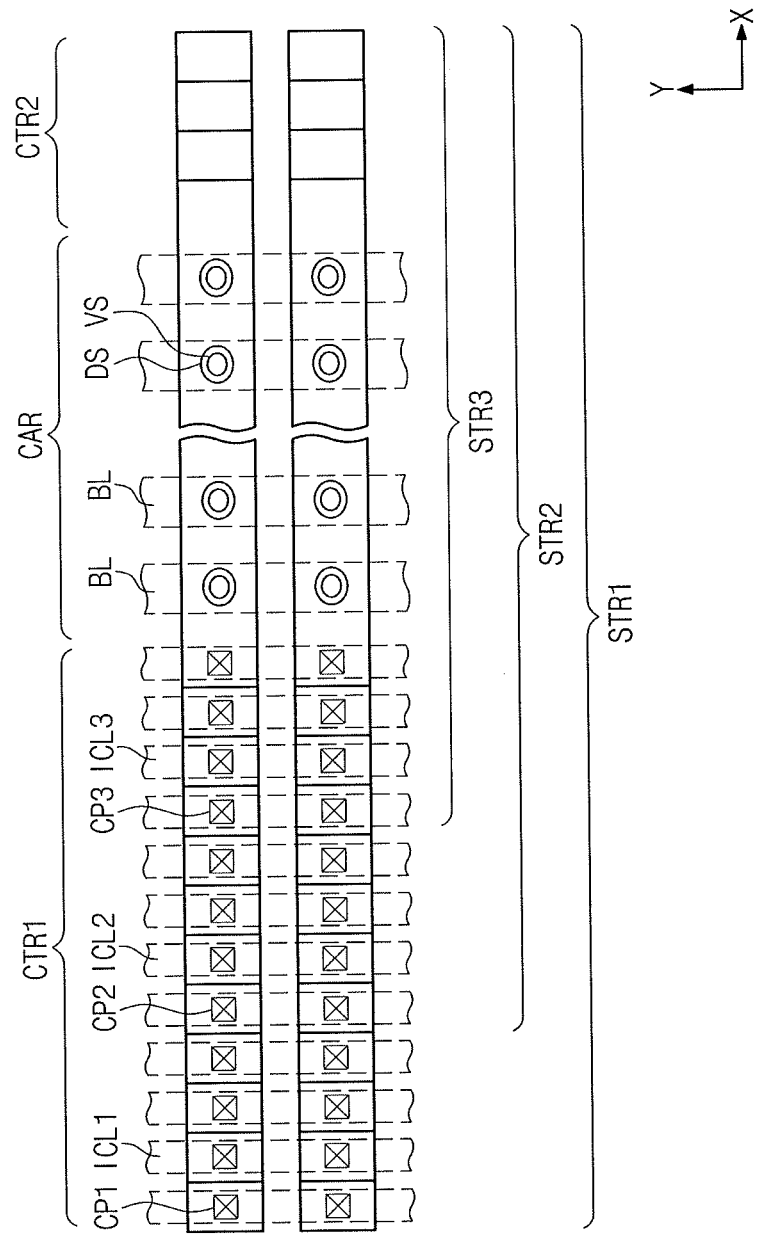
FIG. 9 illustrates a portion of the second embodiment of the three-dimensional semiconductor device.
Figure 10:
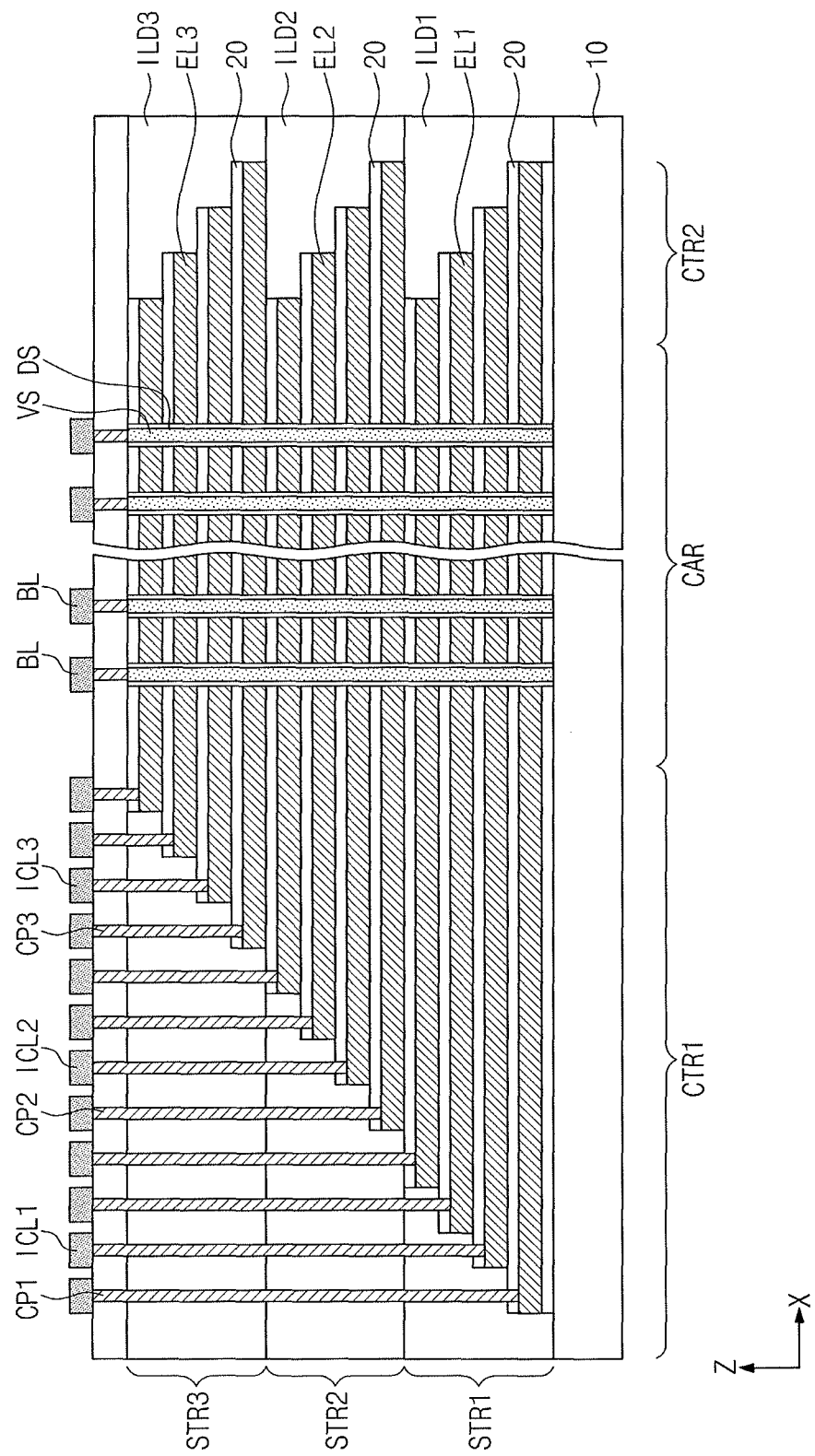
FIG. 10 illustrates a sectional view taken along the x-axis direction of FIG. 9.
Figure 11:
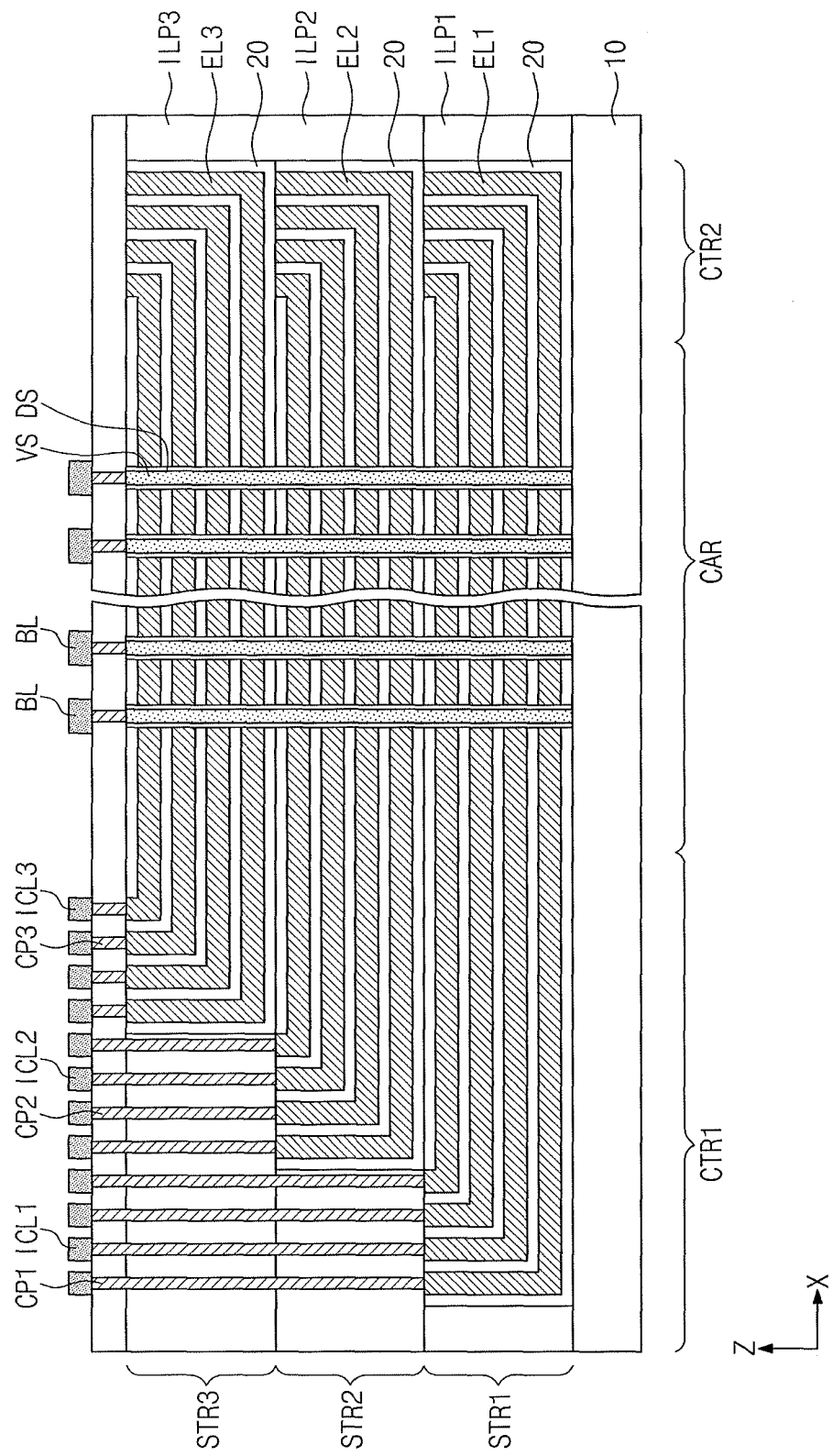
FIG. 11 illustrates a sectional view taken along the x-axis direction of FIG. 9 in accordance with a modification of the second embodiment.

FIG. 8 illustrates a second embodiment of a three-dimensional semiconductor device. FIG. 9 is a plan view illustrating a portion of the device of FIG. 8. FIG. 10 is a sectional view taken along the x-axis direction of FIG. 9. FIG. 11 illustrates a sectional view taken along the x-axis direction of FIG. 9 according to a modification of the second embodiment.

Referring to FIGS. 8 through 11, the substrate 10 may include a cell array region CAR between a first contact region CTR1 and a second contact region CTR2 in an x-axis direction. The cell array region CAR may be located between the dummy regions DMY in a y-axis direction, which, for example, may be perpendicular to or otherwise cross the x-axis direction.

In example embodiments, each of the first to third stacks STR1, STR2, and STR3 may have a plate-shaped structure covering wholly the cell array region CAR of the substrate 10. Alternatively, as shown in FIG. 9, each of the first to third stacks STR1, STR2, and STR3 may have a line-shaped structure extending along the x-axis direction.

As described above, the first to third stacks STR1, STR2, and STR3 may be vertically stacked on the substrate 10. According to the present embodiment, the second stack STR2 may expose the end portions of the first electrodes EL1 on the first contact region CTR1 and may overlap end portions of the first electrodes EU on the second contact region CTR2. The third stack STR3 may expose the end portions of the second electrodes EL2 on the first contact region CTR1 and may overlap the end portions of the second electrodes EL2 on the second contact region CTR2. Since the first to third stacks STR1, STR2, and STR3 are stacked, it is possible to prevent an area of the second contact region CTR2 from increasing, even when the number of the stacked electrodes is increased.

According to the present embodiment, the end portions of the first to third electrodes EL1, EL2, and EL3 may be exposed on the first contact region CTR1. Further, the first to third contact plugs CP1, CP2, and CP3 and the first to third conductive pads ICL1, ICL2, and ICL3 may be provided on the first contact region CTR1.

As shown in FIG. 10, each of the first to third stacks STR1, STR2, and STR3 may have stepwise portions formed on the first and second contact regions CTR1 and CTR2, respectively. As described with reference to FIGS. 4 and 5, the first stack STR1 may include the first electrodes EL1 that are vertically stacked on the substrate 10, and the second stack STR2 may include the second electrodes EL2 that are vertically stacked on the first stack STR1. The third stack STR3 may include the third electrodes EL3 that are vertically stacked on the second stack STR2.

Alternatively, as shown in FIG. 11, each of the first to third electrodes EL1, EL2, and EL3 may include a horizontal portion parallel to the top surface of the substrate 10 and an extended portion parallel to the sidewall of the first insulating pattern ILP1, similar to the embodiments described with reference to FIGS. 6 and 7.

On the first contact region CTR1, the end portions of the first to third electrodes EL1, EL2, and EL3 may be located at different horizontal positions from each other. The end portions of the first electrodes EL1 may have top surfaces located at the same level. Similarly, the end portions of the second electrodes EL2 may have top surfaces located at substantially the same level, and the end portions of the third electrodes EL3 may have top surfaces located at substantially the same level.

Figure 12:
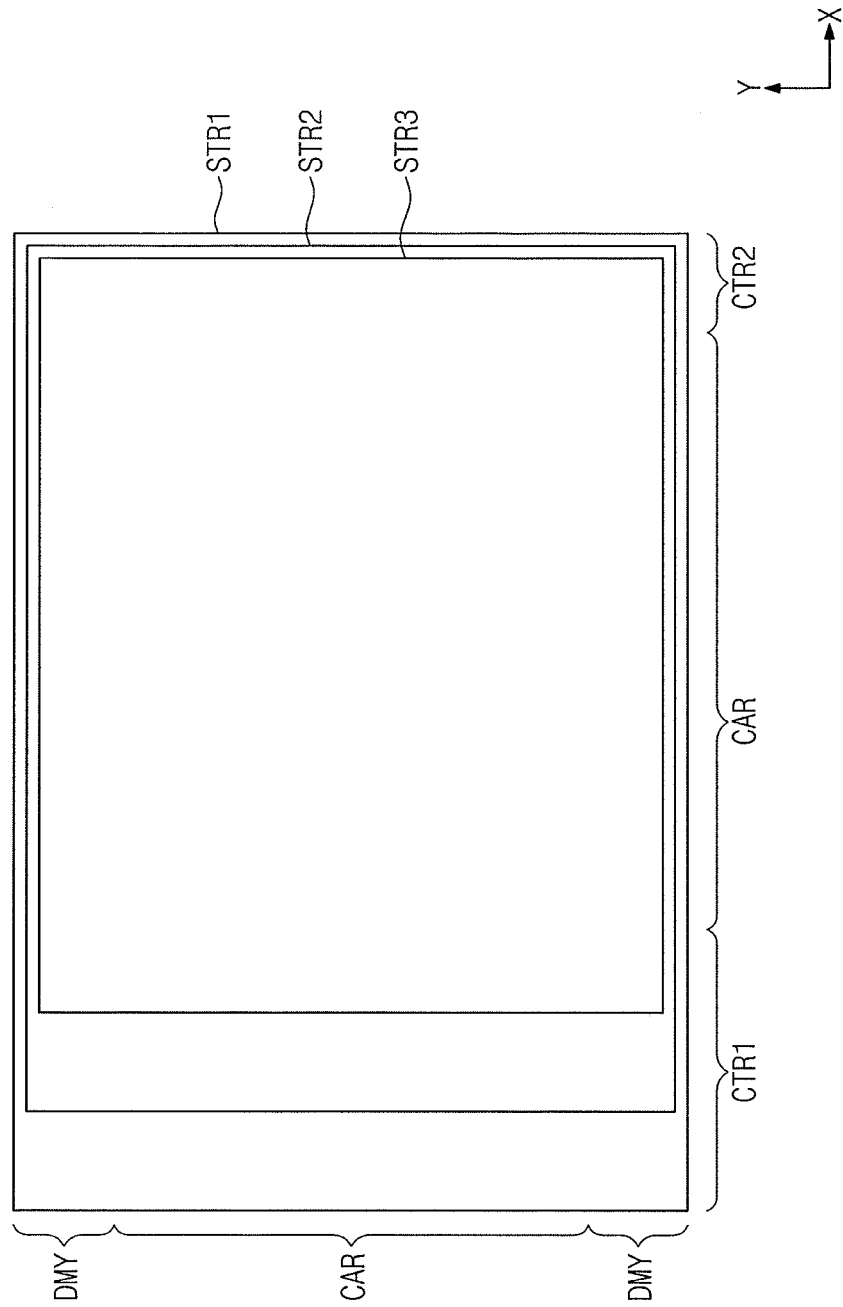
FIG. 12 illustrates a third embodiment of a three-dimensional semiconductor device.
Figure 13:
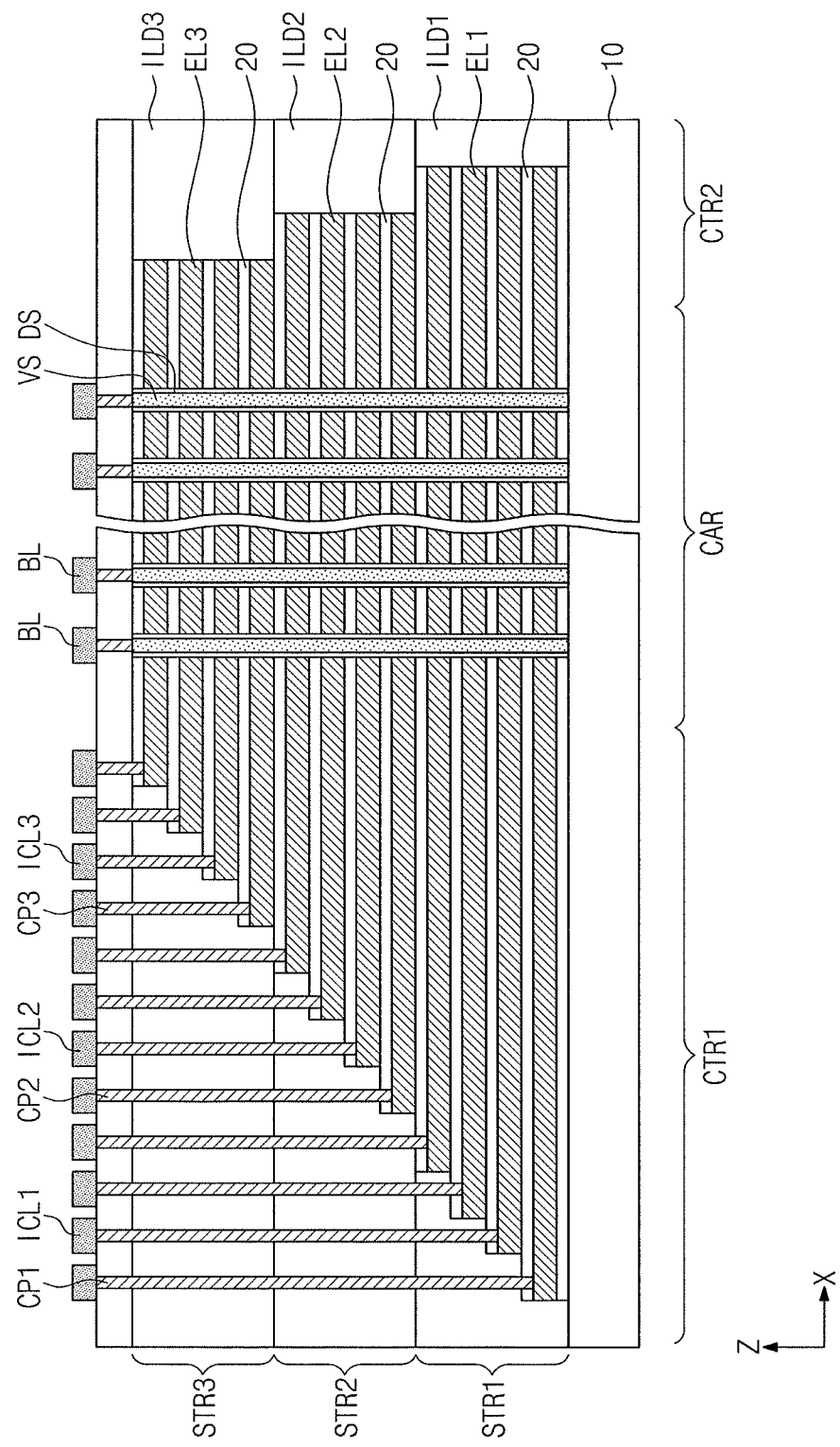
FIG. 13 illustrates a sectional view taken along the x-axis direction of FIG. 12.

FIG. 12 illustrates a third embodiment of a three-dimensional semiconductor device, and FIG. 13 is a sectional view taken along the x-axis direction of FIG. 12. Referring to FIGS. 12 and 13, the substrate 10 may include a first contact region CTR1, a second contact region CTR2, and the cell array region CAR interposed therebetween in an x-axis direction. The cell array region CAR may be located between the dummy regions DMY in y-axis direction, which, for example, is perpendicular to or otherwise crosses the x-axis direction.

The first to third stacks STR1, STR2, and STR3 may be sequentially stacked on the substrate 10. According to the present embodiment, the second stack STR2 may expose the end portions of the first electrodes EL1 on the first contact region CTR1 and may overlap the end portions of the first electrodes EL1 on the second contact region CTR2. The third stack STR3 may expose the end portions of the second electrodes EL2 on the first contact region CTR1 and may overlap the end portions of the second electrodes EL2 on the second contact region CTR2. Since the first to third stacks STR1, STR2, and STR3 are stacked, it is possible to prevent an area of the second contact region CTR2 from increasing, even when the number of the stacked electrodes is increased.

According to the present embodiment, the end portions of the first to third electrodes EL1, EL2, and EL3 may be exposed on the first contact region CTR1. Further, the first to third contact plugs CP1, CP2, and CP3 and the first to third conductive pads ICL1, ICL2, and ICL3 may be provided on the first contact region CTR1.

According to the present embodiment, each of the first to third stacks STR1, STR2, and STR3 may have a sidewall profile that is slanted at an angle to the substrate 10 on the first contact region CTR1, but which is substantially perpendicular to the substrate 10 on the second contact region CTR2. For example, each of the first to third stacks STR1, STR2, and STR3 may have a stepwise structure on the first contact region CTR1, but not on the second contact region CTR2.

More specifically, each of the first electrodes EL1 may include a first sidewall located on the first contact region CTR1 and a second sidewall located on the second contact region CTR2. The first sidewalls of the first electrodes EL1 on the first contact region CTR1 may be located at horizontal positions different from each other, while the second sidewalls of the first electrodes EL1 on the second contact region CTR2 may be vertically aligned to each other. The second and third electrodes EL2 and EL3 may be configured to have substantially the structural features as those of the first electrodes EL1.

In example embodiments, the aligned second sidewalls of the second electrodes EL2 may be located at a horizontal position different from that of the second sidewalls of the first electrodes ELL The aligned second sidewalls of the third electrodes EL3 may be located at a horizontal position different from that of the second sidewalls of the second electrodes EL2.

Figure 14:
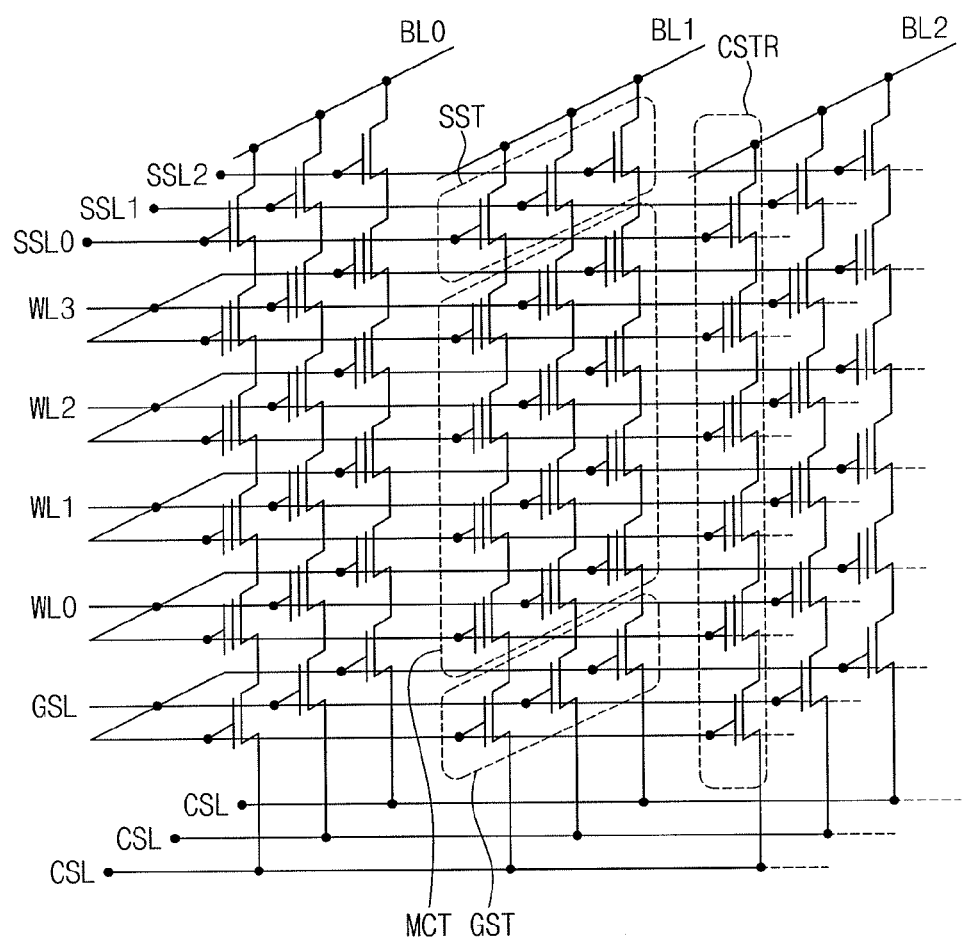
FIGS. 14 and 15 are circuit diagrams illustrating one or more of the aforementioned embodiments of the three-dimensional semiconductor device.
Figure 15:
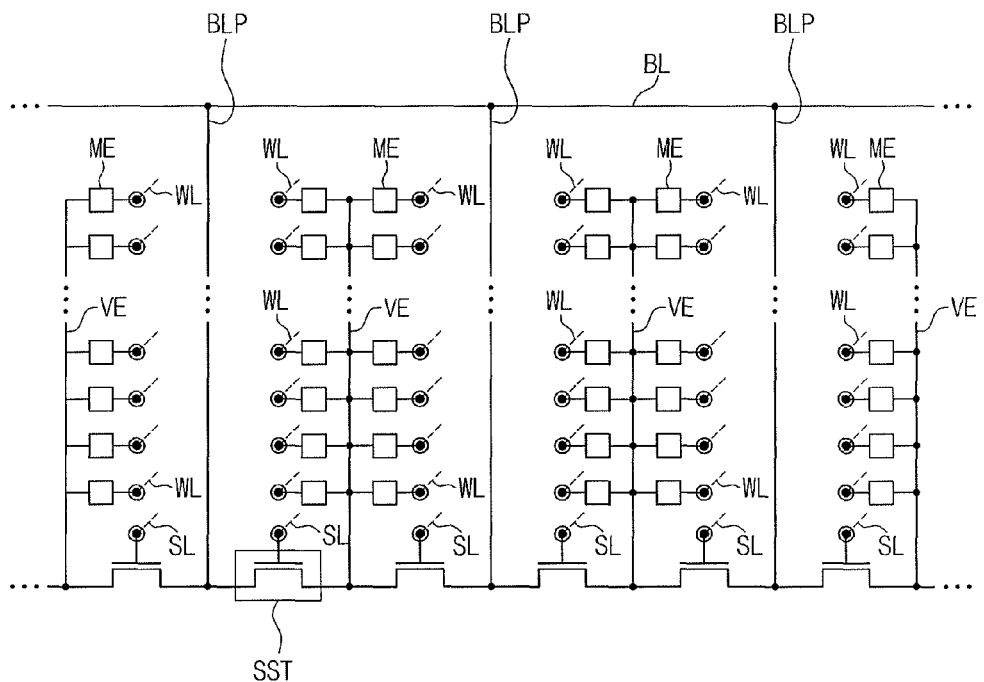

FIGS. 14 and 15 are circuit diagrams illustrating an embodiment of a three-dimensional semiconductor device. Referring to FIG. 14, a three-dimensional semiconductor memory device may include a common source line CSL, a plurality of bit lines BL0, BL1, and BL2, and a plurality of cell strings CSTR disposed between the common source line CSL and the bit lines BL0-BL2.

The common source line CSL may be a conductive pattern provided on the substrate 10 or a doped region provided in the substrate 10. The bit lines BL0-BL2 may be conductive patterns (for example, metal lines) provided over the substrate 10. The bit lines BL0-BL2 may be two-dimensionally arranged, and a plurality of cell strings CSTR may be connected in parallel to each of the bit lines BL0-BL2. Accordingly, the cell strings CSTR may also be two-dimensionally provided on the common source line CSL or the substrate 10.

Each of the cell strings CSTR may include a ground selection transistor GST coupled to the common source line CSL, a string selection transistor SST coupled to one of the bit lines BL0-BL2, and a plurality of memory cell transistors MCT disposed between the ground and string selection transistors GST and SST. The ground selection transistor GST, the string selection transistor SST, and the memory cell transistors MCT may be connected in series to each other. Furthermore, a ground selection line GSL, a plurality of word lines WL0-WL3 and a plurality of string selection lines SSL0-SSL2 may be provided between the common source line CSL and the bit lines BL0-BL2 to serve as gate electrodes of the ground selection transistor GST, the memory cell transistors MCT, and the string selection transistors SST, respectively.

The ground selection transistors GST may be disposed at the substantially same level (for example, relative to the substrate 10), and the gate electrodes thereof may be connected in common to the ground selection line GSL, thereby being in an equipotential state. Similarly, the gate electrodes of the memory cell transistors MCT located at the same level may be connected in common to one of the word lines WL0-WL3, thereby being in an equipotential state. Since each of the cell strings CSTR includes a plurality of the memory cell transistors MCT disposed at different levels from each other, the word lines WL0-WL3 may have a multi-layered structure between the common source line CSL and the bit lines BL0-BL2. The word lines WL0-WL3 of the multi-layered structure may be configured to have the afore-described technical features of the semiconductor devices according to example embodiments.

Each of the cell strings CSTR may include a semiconductor pattern (e.g., the vertical structure VP of FIGS. 4 and 5) vertically extending from the common source line CSL to be connected to one of the bit line BL0-BL3. A data storing layer (e.g., DS of FIGS. 4 and 5) may be provided between the word lines WL0-WL3 and the semiconductor pattern. In example embodiments, the data storing layer (e.g., DS of FIGS. 4 and 5) may include a material or a layer structure configured to store electric charges selectively.

For example, the data storing layer may include one of an insulating layer with many trap sites (e.g., a silicon nitride layer), a floating gate electrode, or an insulating layer provided with conductive nano dots. Data to be stored in the data storing layer DS may be changed by using a Fowler-Nordheim (FN) tunneling effect or a difference between voltages applied to the semiconductor pillars PL and the word lines WL0-WL3. In other embodiments, the data storing layer may include a layer including a phase-changeable material or exhibiting a variable resistance property.

Referring to FIG. 15, a plurality of selection transistors SST may be connected in parallel to a bit line BL via a plurality of bit line plugs BLP. Each of the bit line plugs BLP may be connected in common to a pair of the selection transistors SST disposed adjacent thereto.

A plurality of word lines WL and a plurality of vertical structures VS may be provided between the bit line BL and the selection transistors SST. The word lines WL may be configured to have the afore-described technical features according to example embodiments. The vertical structures VS may be provided between the bit line plugs BLP. For example, the vertical structures VS and the bit line plugs BLP may be alternatingly arranged along a direction parallel to the bit line BL. Furthermore, each of the vertical structures VS may be connected in common to a pair of the selection transistors SST disposed adjacent thereto.

A plurality of memory elements ME may be connected in parallel to each of the vertical structures VS. Each of the memory elements ME may be connected to the corresponding one of the word lines WL. In other words, each of the word lines WL may be connected to the corresponding one of the vertical structures VS via the corresponding one of the memory elements ME.

Each of the selection transistors SST may include a selection line SL serving as a gate electrode thereof. In example embodiments, the selection lines SL may be parallel to the word lines WL.

Figure 16:
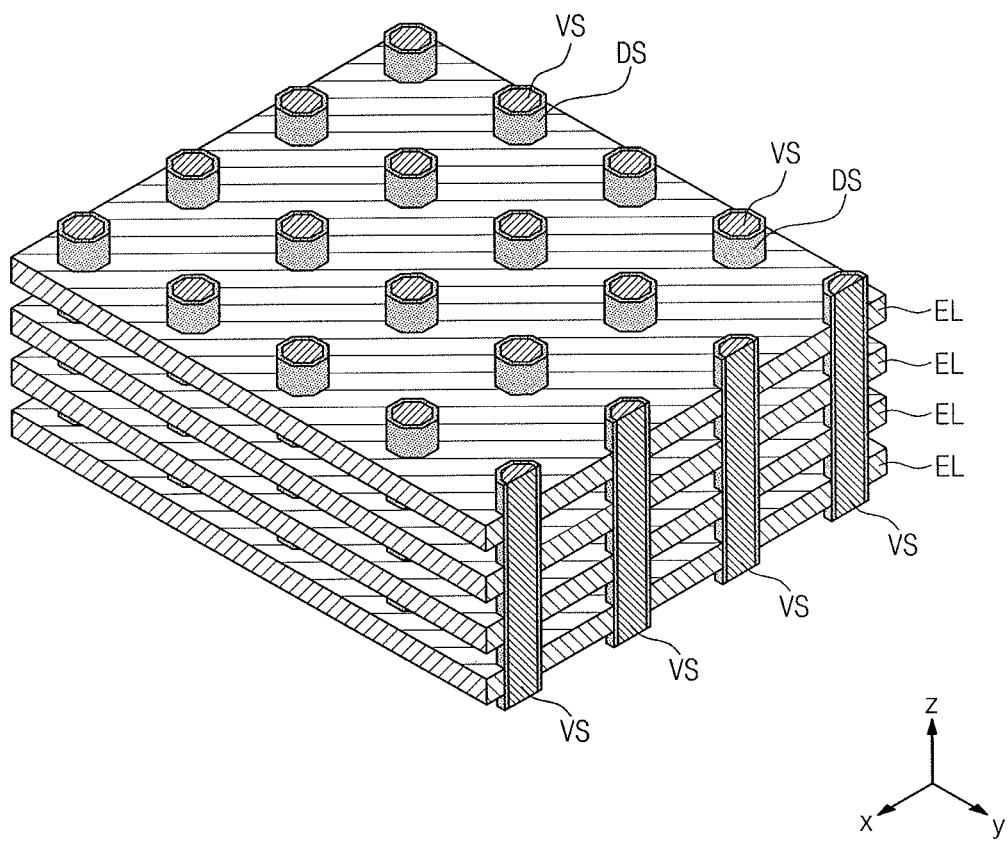
FIGS. 16 through 18 illustrate an embodiment of a cell array structure of a three-dimensional semiconductor device.
Figure 17:
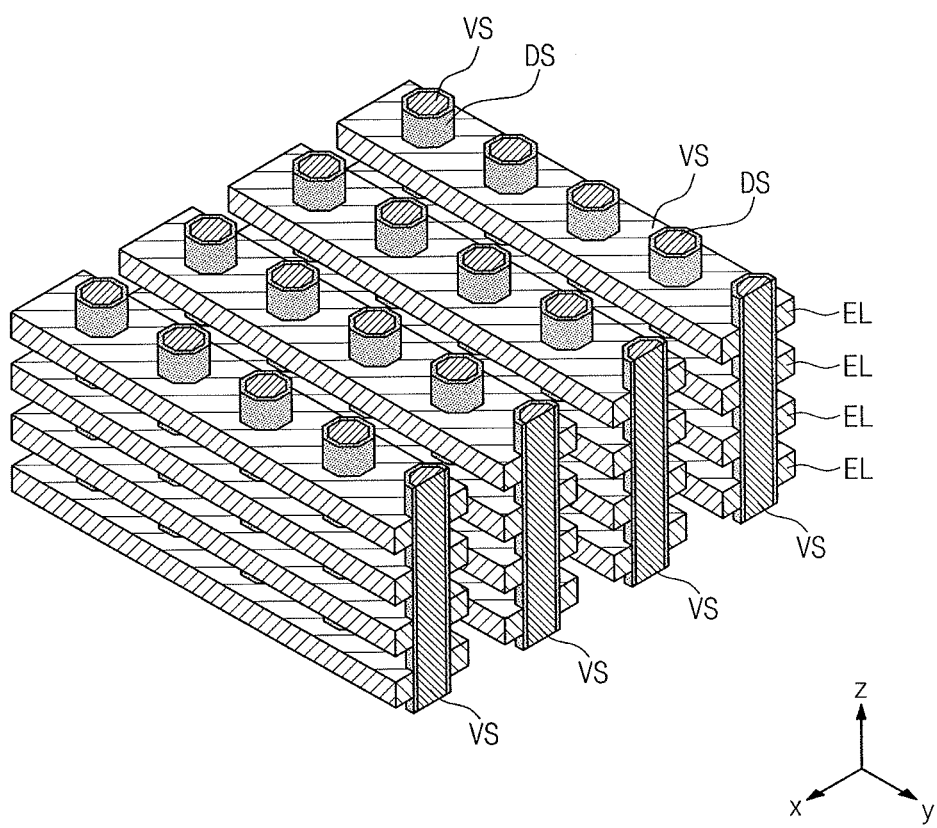
Figure 18:
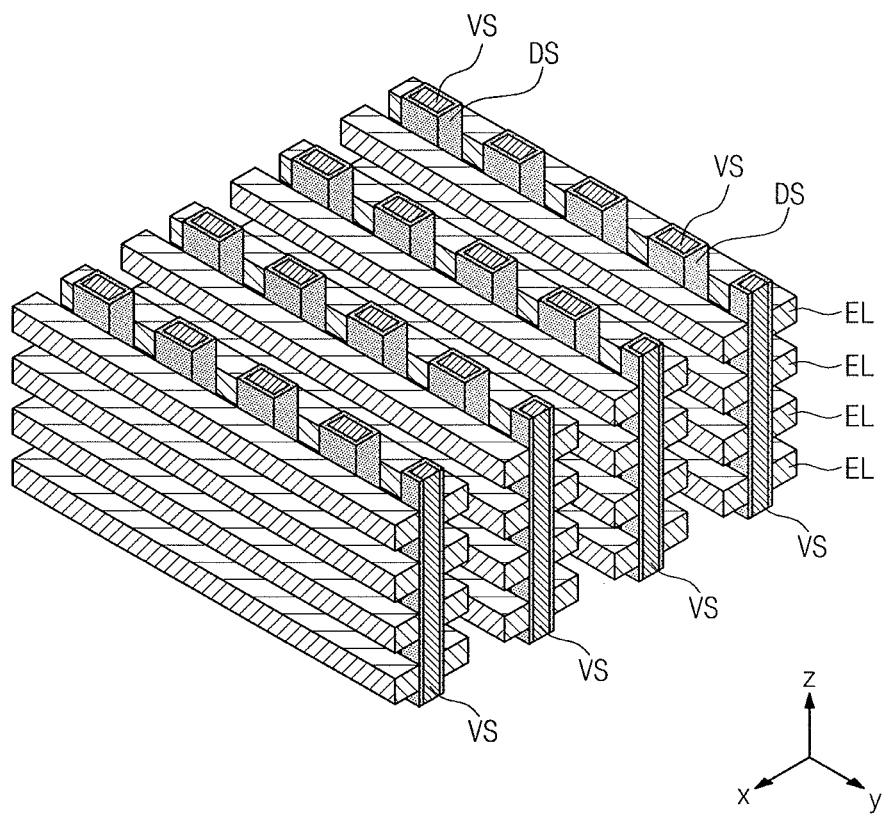

FIGS. 16 through 18 illustrate an embodiment of a cell array structure of a three-dimensional semiconductor device which includes a plurality of horizontal electrodes EL located at different levels from the substrate and parallel to each other. The cell array structure also includes a plurality of vertical structures VS extending at an angle (e.g., perpendicular) to the horizontal electrodes EL. The cell array structure may further include data storing patterns DS interposed between sidewalls of the horizontal electrodes EL and the vertical structures VS. The horizontal electrodes EL of FIGS. 16 through 18 may serve as the first to third electrodes described with reference to FIGS. 2 through 13. The vertical structures VS may include semiconductor pillars or conductive electrodes.

In example embodiments, as shown in FIG. 16, each of the horizontal electrodes EL may have a plate shape. For example, in plan view, lengths, in x and y directions, of each of the horizontal electrodes EL may have ten or more times greater than those of each of the vertical structures VS. Each of the horizontal electrodes EL may have a plurality of holes that are two-dimensionally formed therethrough. The vertical structures VS may be provided to pass through the holes of the horizontal electrodes EL that are disposed at levels different from each other. Each of the vertical structures VS may be connected to the corresponding one of the vertical structures VS.

In other embodiments, as shown in FIG. 17, the horizontal electrodes EL may be three-dimensionally arranged, and each of the horizontal electrodes EL may have a line shape crossing a plurality of the vertical structures VS. For example, a length of each horizontal electrode EL may be ten times or greater than a width of each vertical structure VS. A width of each horizontal electrode EL may be smaller than three times a width of each vertical structure VS.

Each of the horizontal electrodes EL may have a plurality of holes that are one-dimensionally formed therethrough. The vertical structures VS may be provided to pass through the holes of the horizontal electrodes EL that are disposed at levels different from each other. Similar to the case of FIG. 16, each of the vertical structures VS may be connected to the corresponding one of the vertical structures VS.

In other embodiments, as shown in FIG. 18, the horizontal electrodes EL may be three-dimensionally arranged, and each of them may have a line shape crossing a plurality of the vertical structures VS. The vertical structures VS may be horizontally separated from each other to define a slit, in which a plurality of the vertical structures VS are one-dimensionally provided.

For example, a pair of the horizontal electrodes EL disposed at respective sides of each of the vertical structures VS may be horizontally separated from each other, thereby being able to have electric potentials different form each other. In example embodiments, although not depicted in the drawings, one of the pair of horizontal electrodes EL may be connected to an external circuit via a left-end portion thereof, while the other may be connected to other external circuit via a right-end portion thereof.

Alternatively, a pair of the horizontal electrodes EL, which are disposed at both sides of each vertical structure VS, may be electrically connected to each other to be in an equipotential state. For example, each of the vertical structures VS may be formed to define at least one hole penetrating therethrough. However, unlike the aforementioned embodiments described with reference to FIGS. 16 and 17, a plurality of the vertical structures VS may be provided through each of the holes.

Figure 19:
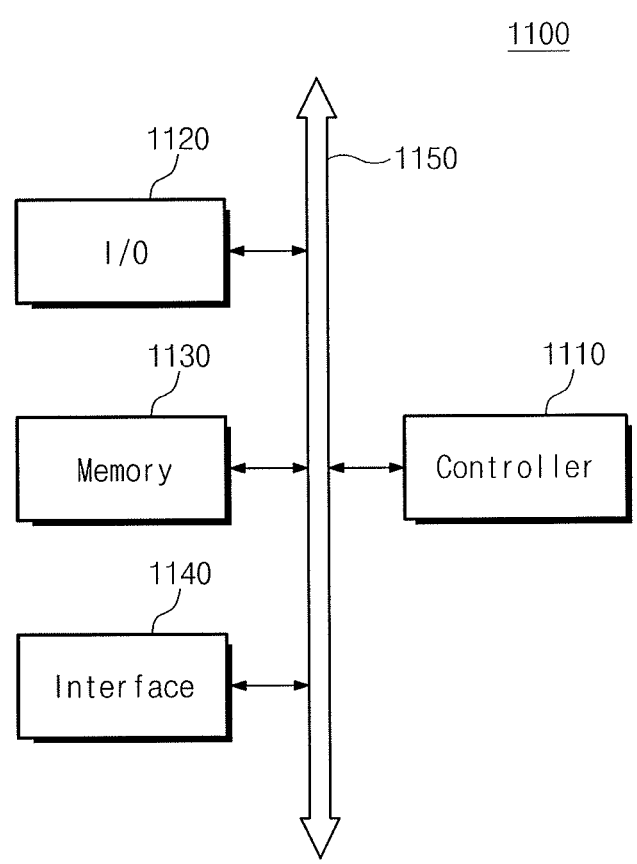
FIG. 19 illustrates an example of a memory system which may include any of the aforementioned embodiments of the three-dimensional semiconductor memory device.

FIG. 19 illustrates an embodiment of a memory system 1900 including at least one three-dimensional semiconductor memory device. Referring to FIG. 19, a memory system 1100 may be applied to a PDA (personal digital assistant), a portable computer, a web tablet, a wireless phone, a mobile phone, a digital music player, a memory card and/or all the devices that can transmit and/or receive data in a wireless communication environment.

The memory system 1100 may include a controller 1110, an input/output device 1120 (e.g., a keypad and/or a display device), a memory 1130, an interface 1140 and a bus 1150. The memory 1130 and the interface 1140 may communicate with each other through the bus 1150.

The controller 1110 may include a microprocessor, a digital signal processor, a micro controller and/or other process devices similar to the microprocessor, the digital signal processor and the micro controller. The memory 1130 may be used to store an instruction executed by the controller 1110. The input/output device 1120 may receive data and/or a signal from the outside of the system 1100 and/or transmit data and/or a signal to the outside of the system 1100. For example, the input/output device 1120 may include a keyboard, a keypad and/or a displayer.

The memory 1130 may include the three-dimensional semiconductor memory device according to any of the aforementioned embodiments. The memory 1130 may further include a different kind of memory, a volatile memory device capable of random access and various kinds of memories. The interface 1140 may transmit data to a communication network and/or may receive data from a communication network.

Figure 20:
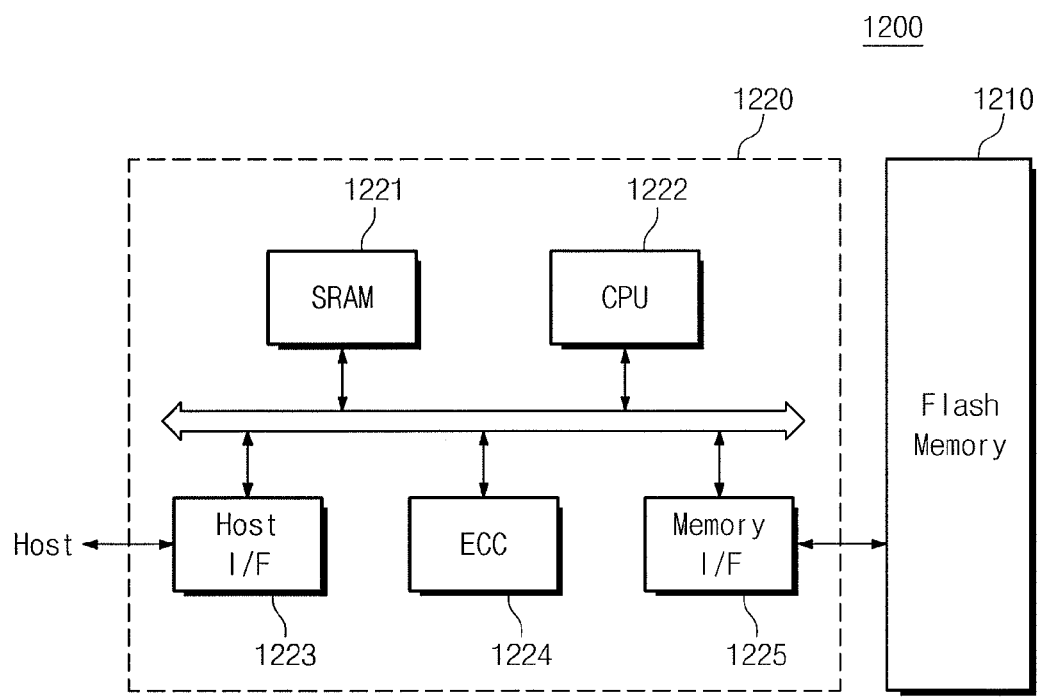
FIG. 20 illustrates an example of a memory card including any one of the aforementioned embodiments of the three-dimensional semiconductor memory device.

FIG. 20 illustrates an embodiment of a memory card 1200 including at least one three-dimensional semiconductor memory device. Referring to FIG. 20, a memory card 1200 for supporting a storage capability of a large capacity may be fitted with a semiconductor memory device 1210 according to any of the aforementioned embodiments. The memory card 1200 may include a memory controller 1220 that may control every data exchange between a host and the semiconductor memory device 1210.

A static random access memory (SRAM) 1221 may be used as an operation memory of a processing unit 1222. A host interface 1223 may include data exchange protocols of a host that may be connected to the memory card 1200. An error correction block 1224 may detect and/or may correct errors that may be included in data readout from a multi bit semiconductor memory device 1210. A memory interface 1225 may interface with the semiconductor memory device 1210 of at least some example embodiments. The processing unit 1222 may perform every control operation for exchanging data of the memory controller 1220. In one embodiment, the memory card 1200 may include a ROM for storing code data for interfacing with the host.

Figure 21:
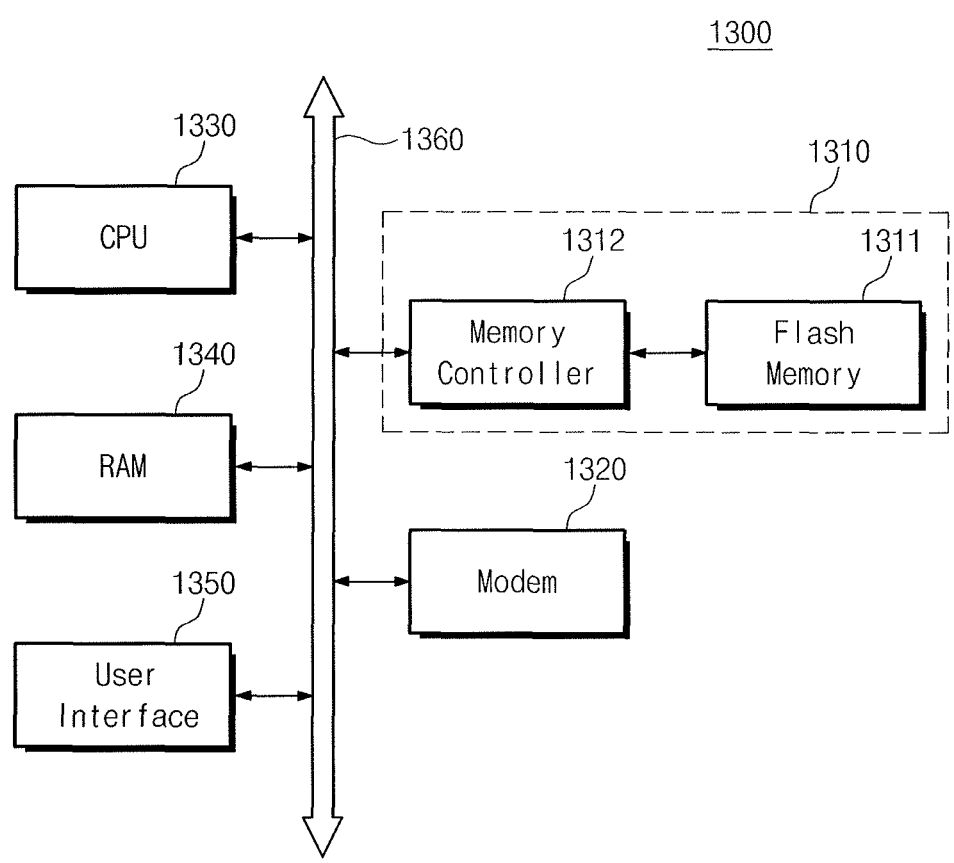
FIG. 21 illustrates an example of information processing systems including any one of the aforementioned embodiments of the three-dimensional semiconductor memory device.

FIG. 21 illustrates an embodiment of an example of information processing system 1300 which includes at least one three-dimensional semiconductor memory devices. Referring to FIG. 21, an information processing system 1300 may include a 3D semiconductor memory system 1310 including a 3D semiconductor memory device according to any of the aforementioned embodiments. The semiconductor memory system 1310 may be mounted to an information processing system, for example, a mobile device and/or a desktop computer.

The information processing system 1300 may also includes a modem 1320, a central processing unit (CPU) 1330, a RAM 1340, and a user interface 1350 electrically connected to a system bus 1360. The semiconductor memory system 1310 may be configured similarly to that described with respect to FIG. 20, and may include a 3D semiconductor memory device 1311, and a memory controller 1312.

A memory system 1310 may be a solid state drive SSD. Data that may be processed by the CPU 1330 and/or input from the outside may be stored in the SSD. The information processing system 1300, configured as described and including a 3D semiconductor memory device, may reliably store a large amount of data in the semiconductor memory system 1310. The semiconductor memory system 1310 may conserve resources for error correction and a high speed data exchange function may be provided. In one embodiment, the information processing system 1300 may include an application chipset, a camera image processor (CIS) and/or an input/output device.

Furthermore, a semiconductor memory device and/or memory system that may include the same may be packaged in various kinds of ways. For instance, the semiconductor memory device and/or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

According to one or more embodiments described above, a stack is provided to include vertically stacked electrodes. The stack is configured in such a way that a contact region having a stepwise structure has a reduced occupying area. Accordingly, it is possible to increase integration, e.g., a ratio of an area of a cell array region to a total chip area.

Example embodiments have been disclosed herein, and although specific terns are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:
   a substrate including a cell array region between first and second contact regions;

a first stack including a plurality of first electrodes vertically provided on the substrate; and a second stack including a plurality of second electrodes vertically provided on the first stack, wherein the second stack is arranged to expose end portions of the first electrodes on the first contact region and overlap end portions of the first electrodes on the second contact region.

2. The device as claimed in claim 1, wherein the first electrodes in the first stack and the second electrodes in the second stack have a stepwise structure.

3. The device as claimed in claim 2, further comprising:
first contact plugs on the first contact region and connected to respective ones of the first electrodes; and
second contact plugs on the second contact region and connected to respective ones of the second electrodes.

4. The device as claimed in claim 2, further comprising:
first contact plugs on the first contact region and connected to respective ones of the first electrodes; and
second contact plugs on the first contact region and connected to respective ones of the second electrodes.

5. The device as claimed in claim 1, wherein:
a longest one of the second electrodes has a first length,
a shortest one of the first electrodes has a second length, and
the first length is greater than the second length.

6. The device as claimed in claim 1, wherein the first electrodes comprise:
first sidewalls located at different horizontal positions on the first contact region, and
second sidewalls vertically aligned with each other on the second contact region.

7. The device as claimed in claim 1, wherein a longest one of the second electrodes is shorter than a shortest one of the first electrodes.

8. The device as claimed in claim 1, wherein each of the first and second stacks has a sloped profile on the first contact region and a vertical profile on the second contact region.

9. The device as claimed in claim 1, wherein each of the first and second electrodes comprises extended portions extending at an angle relative to a top surface of the substrate, and wherein extended portions of each of the first and second stacks have top surfaces that are substantially coplanar with each other.

10. The device as claimed in claim 1, wherein:
the substrate comprises the cell array region and the first and second contact regions in a first direction, and the cell array region and dummy regions at respective sides of the cell array region in a second direction perpendicular to the first direction, and
a horizontal length of the first stack in the second direction is substantially equal to a horizontal length of the second stack.

11. The device as claimed in claim 1, further comprising:
a third stack including a plurality of third electrodes vertically provided on the second stack, wherein the third stack is arranged to expose end portions of the second electrodes on the second contact region, to expose end portions of the first electrodes on the first contact region, and to overlap end portions of the second electrodes on the first contact region.

12. The device as claimed in claim 11, further comprising:
first contact plugs on the first contact region and connected to respective ones of the first electrodes;
second contact plugs on the second contact region and connected to respective ones of the second electrodes; and
third contact plugs provided on the first contact region and connected to respective ones of the third electrodes.

13. The device as claimed in claim 1, further comprising:
a third stack including a plurality of third electrodes vertically provided on the second stack, wherein the third stack is arranged to expose end portions of the second electrodes on the first contact region and to overlap end portions of the first and second electrodes on the second contact region.

14. The device as claimed in claim 13, further comprising:
first contact plugs on the first contact region and connected to respective ones of the first electrodes;
second contact plugs on the first contact region and connected to respective ones of the second electrodes; and
third contact plugs on the first contact region and connected to respective ones of the third electrodes.

15. The device as claimed in claim 1, further comprising:
vertical structures on the cell array region that penetrate the first and second stacks; and
data storing elements interposed between the vertical structures and the first and second electrodes.

16. A three-dimensional semiconductor device, comprising:
a cell array region between first and second contact regions;
a plurality of first electrodes having ends vertically arranged over the first contact region; and
a plurality of second electrodes having ends vertically arranged over the second contact region, wherein the ends of the first electrodes are arranged to have a first stepwise pattern and the ends of the second electrodes are arranged to have a second stepwise pattern different from the first stepwise pattern.

17. The device as claimed in claim 16, wherein the ends of a first number of the first electrodes overlap the ends of a second number of the first electrodes over at least one of the first contact region or the second contact region.

18. The device as claimed in claim 17, wherein the first number is at least one and the second number is at least one.

19. The device as claimed in claim 16, wherein the first and second electrodes overlap the cell array region.

20. The device as claimed in claim 16, wherein:
the ends of the first electrodes over the first contact region are arranged to have a first slope, and
ends of the first electrodes over the second contact region are arranged to have a second slope different from the first slope.

* * * * *